(12) United States Patent
Itoh et al.

(10) Patent No.: US 8,068,194 B2
(45) Date of Patent: Nov. 29, 2011

(54) LINE LIGHT SOURCE DEVICE, PLANE LIGHT EMISSION DEVICE, PLANE LIGHT SOURCE DEVICE, AND LIQUID CRYSTAL DISPLAY

(75) Inventors: Shin Itoh, Mihara (JP); Masato Sumikawa, Kashihara (JP); Yoshinobu Nakamura, Higashihiroshima (JP); Masahiro Ikehara, Nara (JP); Tsukasa Inoguchi, Kitakatsuragi-gun (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 740 days.

(21) Appl. No.: 12/137,197

(22) Filed: Jun. 11, 2008

(65) Prior Publication Data

US 2009/0296017 A1    Dec. 3, 2009

(30) Foreign Application Priority Data

Jun. 13, 2007  (JP) ................................. 2007-156119
May 30, 2008  (JP) ................................. 2008-142689

(51) Int. Cl.
*G02F 1/1333*      (2006.01)

(52) U.S. Cl. ........................................................ 349/62

(58) Field of Classification Search ............. 349/62
See application file for complete search history.

(56) References Cited

U.S. PATENT DOCUMENTS

| 5,676,453 | A | 10/1997 | Parkyn, Jr. et al. |
| 7,168,841 | B2 | 1/2007 | Hsieh et al. |
| 7,436,000 | B2 * | 10/2008 | Kim et al. ....................... 257/98 |
| 2006/0186431 | A1 | 8/2006 | Miki et al. |
| 2006/0219883 | A1 | 10/2006 | Mizutani |
| 2007/0047261 | A1 | 3/2007 | Thompson et al. |
| 2007/0109792 | A1 | 5/2007 | Chosa et al. |

FOREIGN PATENT DOCUMENTS

| CN | 1303642 | 3/2007 |
| DE | 10 2005 031 615 | 2/2006 |
| DE | 20 2006 012 216 | 12/2006 |
| JP | 3-188685 | 8/1991 |
| JP | 10-82915 | 3/1998 |
| JP | 11-53919 | 2/1999 |
| JP | 11-329045 | 11/1999 |
| JP | 2004-79461 | 3/2004 |
| JP | 2004-165124 | 6/2004 |
| JP | 2004-235139 | 8/2004 |
| JP | 2005-39129 | 2/2005 |
| JP | 2006-229055 | 8/2006 |
| JP | 2006-278205 | 10/2006 |
| JP | 2006-324224 | 11/2006 |

* cited by examiner

*Primary Examiner* — James Dudek
(74) *Attorney, Agent, or Firm* — Morrison & Foerster LLP

(57) ABSTRACT

In the line light source device and the plane light emission device, first recesses 14 are formed between adjoining light emission elements 5, on surfaces of sealing resin layers 10 opposite to the board 4. The line light source device and the plane light emission device, in which the light emission elements are coated with resin, have a simple configuration and high uniformity in luminous intensity in an emission end face of the device.

14 Claims, 26 Drawing Sheets

LINE LIGHT SOURCE DEVICE, PLANE LIGHT EMISSION DEVICE, PLANE LIGHT SOURCE DEVICE, AND LIQUID CRYSTAL DISPLAY

CROSS-REFERENCE TO RELATED APPLICATIONS

This nonprovisional application claims priority under 35 U.S.C. §119(a) on Patent Application No(s). 2007-156119 filed in Japan on Jun. 13, 2007 and 2008-142689 filed in Japan on May 30, 2008, the entire contents of which are hereby incorporated by reference.

BACKGROUND OF THE INVENTION

The present invention relates to a line light source device, a plane light emission device that are preferably used as a backlight of a liquid crystal display panel, e.g., in a portable telephone, a digital camera, or a portable game machine, and a liquid crystal display.

The invention particularly relates to a line light source device that are preferably used as a backlight of a liquid crystal display panel of a portable telephone having a frame reduced in size and thickness and shaped like a narrow picture frame, a personal digital assistant, a digital camera, a portable game machine or the like, a plane light emission device, and a liquid crystal display.

The invention also relates to a plane light source device having a configuration in which a plurality of light emission element units each having a light emission element and a resin part that covers the light emission element are placed in a predetermined two-dimensional pattern without a gap on a surface of a board.

Among conventional line light source devices is one disclosed in JP 2004-235139 A, for example.

FIG. 19A is a perspective view of the line light source device disclosed in the publication, FIG. 19B is a longitudinal section of the line light source device, and FIG. 19C is a section of the line light source device, the section taken along a direction of width of the device. FIGS. 20A through 20F are diagrams illustrating a procedure of a method of manufacturing the line light source device.

FIG. 21 is a perspective view of a plane light emission device having the line light source device, and FIG. 22 is a widthwise section of the line light source device in the plane light emission device.

The line light source device shown in FIGS. 19A, 19B, and 19C, the method of manufacturing the line light source device shown in FIGS. 20A through 20F, and the plane light emission device shown in FIGS. 21, 22 are identical to the line light source device, the method of manufacturing the line light source device, and the plane light emission device that are disclosed in the publication. Therefore, description thereof is omitted.

FIG. 23A is a perspective view of another conventional line light source device, and FIG. 23B is a longitudinal section of the line light source device. FIG. 24 is a section of the conventional line light source device, the section taken along a direction of width of the device. In the line light source device shown in FIGS. 23A, 23B, and 24, light emission elements 1001 on a board 1000 are covered with a resin part 1002 shaped like a simple rectangular parallelepiped.

The plane light emission device shown in FIGS. 21 and 22 is laid on a bottom surface of a liquid crystal display part of a portable telephone, a digital camera, a portable game machine or the like.

The line light source device shown in FIG. 19A has an advantage in that light distribution characteristics of the light source can be adjusted and in that the plane light emission device in which the line light source device is incorporated thus resists producing unevenness in luminance, in comparison with the line light source device that is shown in FIG. 23A and that has light emission elements simply coated with resin. The line light source device has another advantage in that the device resists stripping when undergoing thermal expansion or thermal contraction.

On the other hand, there is a problem in that the device emitting light with high luminance may cause unevenness in luminance, particularly, accompanied by bright lines diagonal to a light incident part of a light guide plate. Necessity of provision of reflector plates therein leads to an increase in number of components, which causes an increase in number of man-hours required for affixation of the components onto the board.

SUMMARY OF THE INVENTION

An object of the invention is to provide a line light source device that has a simple configuration having light emission elements coated with resin and that has high uniformity in luminous intensity in an emission end face thereof such that the plane light emission device in which the line light source device is incorporated resists producing bright lines on an emission surface when emitting light with high luminance.

Another object of the invention is to provide a line light source device and a liquid crystal display that resist stripping of coating resin which might be caused by thermal expansion and contraction, in spite of the simple configuration merely coated with resin.

The invention is also intended for providing a plane light emission device having the line light source device that attains such functional effects.

Another object of the invention is to provide a plane light source device by which unevenness in luminance in a surface thereof can be reduced.

In order to achieve the above object, there is provided a line light source device comprising:
a board extending in a longitudinal direction thereof and having a surface,
a plurality of light emission elements placed on the surface of the board at some intervals along the longitudinal direction, and
resin parts that are placed so as to cover the plurality of light emission elements, wherein
surfaces of the resin parts opposite to the board with respect to a direction of a normal to the surface of the board have first recesses between the light emission elements adjoining in the longitudinal direction.

On the surface of the board are typically formed electrode patterns.

In the invention, light having progressive components in the longitudinal direction can efficiently be taken out of the first recesses.

This function will be described below with reference to FIGS. 11A and 11B. In the device in which the first recess 900 exists between the adjoining light emission elements as shown in FIG. 11A, luminances on intermediate positions between the adjoining light emission elements where the luminances tend to be decreased by absence of the light emission elements can be increased by efficient takeout of longitudinally guided light 901 as emitted light 902, in comparison with a device shown in FIG. 11B in which the first recess does not exist.

Thus uniformity in luminous intensity in an emission end face of the line light source device can be made excellent. FIG. 11C is a diagram showing a ray of light that is not emitted to outside from vicinity of the first recess in the device having the first recess. Measures to reduce such light that is not emitted to outside will be described later.

According to the invention, the resin parts that cover the light emission elements have the first recesses and light can efficiently be emitted from the vicinity of the first recesses, so that reflector plates extending in the longitudinal direction between the light emission elements do not necessarily have to be provided. Therefore, a process of affixing the reflector plates onto the board in the line light source device can be omitted. As a result, manufacturing cost for the device can be reduced and the device can be simply produced.

In the invention, strain caused by thermal expansion and contraction between the continuous rod-like resin parts and the board can efficiently be relaxed by the first recesses that are formed as cut-outs having steeply changing sections by reduction in thickness of portions of the resin parts corresponding to the first recesses in the direction of the normal, for example. Thus stripping of the resin parts that might be caused by thermal expansion and contraction can be prevented.

In one embodiment of the invention, the surfaces of the resin parts have second recesses in regions corresponding to the light emission elements in the direction of the normal.

According to the embodiment, the second recesses are capable of suppressing direct outgoing of light emitted by the light emission elements, or if some phosphor exists in vicinity of the elements, light emitted by the phosphor due to the light derived from the light emission elements. Quantity of light traveling in the longitudinal direction can be increased by reflection and total reflection caused on the surfaces linking the second recesses and the first recesses, and the light increased in quantity can efficiently be taken out from the first recesses.

That is, distribution characteristics of the light can be controlled. Thus luminances just above the light emission elements 5 that are prone to be excessively high can be reduced and luminances on intermediate positions between two adjoining light emission elements that are prone to be decreased by absence of the light emission element can be increased by the efficient takeout of the light guided in the longitudinal direction. Thus the longitudinal uniformity in luminous intensity in the emission end face of the line light source device can be improved. Therefore, a plane light emission device in which the line light source device having high uniformity in luminance is installed and which emits light with high luminance resists producing bright lines, unevenness in luminance, and the like in the emitted light.

In one embodiment of the invention, the surface of the board has a property of reflecting light.

According to the embodiment in which the surface of the board has the property of reflecting light, light guided in the longitudinal direction can be inhibited from being absorbed by the board and loss in energy of the light being guided can be reduced. Thus the uniformity in luminous intensity in the emission end face of the line light source device can be further improved.

In one embodiment of the invention, the resin parts each have portions in which distance from the surface of the board to the first recess in the direction of the normal decreases with distance from the light emission element in the longitudinal direction within a range from center of the light emission element to a midpoint between the light emission element and the next light emission element in the longitudinal direction.

According to the embodiment, light guided in the longitudinal direction can efficiently be taken out from the first recesses, because the resin parts each have the portions in which the distance from the surface of the board to the first recess in the direction of the normal decreases with the distance from the light emission element in the longitudinal direction within the range from the center of the light emission element to the midpoint between the light emission element and the next light emission element in the longitudinal direction.

With such a configuration, the second recesses are capable of suppressing direct outgoing of light emitted by the light emission elements, or if some phosphor exists in vicinity of the elements, light emitted by the phosphor due to the light derived from the light emission elements, and light traveling in the longitudinal direction can efficiently be concentrated on vicinity of centers of the first recesses by the reflection and the total reflection caused on the surfaces linking the second recesses and the first recesses. Light can efficiently be taken out from a larger area on the first recesses.

Accordingly, the distribution characteristics of the light can be accurately controlled. Thus luminances just above the light emission elements that are prone to be excessively high can be reduced and luminances on the intermediate positions between the light emission elements that are prone to be decreased by absence of the light emission elements can be increased because light can effectively be guided in the longitudinal direction.

According to the embodiment, the uniformity in the line light source device in the longitudinal direction can be further improved because spot intensity at a point in the intermediate positions between longitudinally adjoining light emission elements is not only improved but light can be taken out throughout the first recesses formed widely. Thus the uniformity in luminous intensity in the emission end face of the line light source device can be increased.

When light traveling at an angle of elevation of $\alpha(i)$ to the horizontal surface of the board undergoes total reflection on the resin surface having an angle of inclination of $\theta(i)$ to the board, as shown in FIG. 12A, the light is incident on and reflected from the resin surface at an angle of $\alpha(i)+\theta(i)$ to the resin surface, so that an angle of a traveling direction of the light to the horizontal surface of the board results in $\alpha(i+1)=\alpha(i)+2\cdot\theta(i)$. Once the light undergoes mirror reflection on the surface of the board and subsequently total reflection on the resin surface, the direction of the travel is further changed so as to have an angle of $\alpha(i+2)=\alpha(i+1)+2\cdot\theta(i+1)$. Thus each reflection on a border between the resin and air increases absolute value of the angle of elevation by $\Delta\alpha(i)=\alpha(i+1)-\alpha(i)=2\cdot\theta(i)$.

As shown in FIG. 12B, when an angle $\alpha(j)+\theta(j)$ of incidence of the light of which the direction of travel has gradually been changed in such a manner on the resin surface exceeds 90°−θc (wherein θc is a critical angle for the total reflection on the border between the resin and air), the light is refracted on the border between the coating resin layer and the air layer and is subsequently emitted into the air.

This phenomenon occurs throughout the portions of the resin parts where the distance decreases and thus light more uniform with respect to the longitudinal direction can be emitted.

In one embodiment of the invention, the first recesses have portions that cause total reflection of light traveling in the longitudinal direction.

According to the embodiment, such a phenomenon as shown in FIG. 11C, that is, the phenomenon in which light traveling in a generally horizontal direction passes over the first recess and reenters the next sealing resin layer, can be reduced and thus an efficiency of takeout of light can be increased, because the first recess has portions in which the angles of inclination of an inclined surface of the first recess with the normal to the board are not less than the critical angle θc for total reflection and which cause total reflection of light traveling in parallel to the longitudinal direction.

That is, the light traveling in parallel to the longitudinal direction undergoes total reflection on the surface of the resin and the direction of travel thereof is thereby leaned, on condition that the surface is inclined so that the angles formed by the normal to the board and the surface of the resin part are not less than the critical angle θc for total reflection. As a result, light that cannot be taken out by conventional devices can effectively be taken out from the first recess near the midpoint between two adjoining light emission elements.

In one embodiment of the invention, the second recesses have portions that cause total reflection of light traveling in the direction of the normal to the board.

According to the embodiment, uniformity in luminous intensity distribution in the longitudinal direction can be further improved because the angles of inclination of inclined surfaces of the second recesses are made equal to or larger than the critical angle θc for total reflection so that the second recesses have portions that cause total reflection of light traveling in a normal direction of the board.

Specifically, the direction of travel of light of high intensity emitted upward in an optical axial direction of the light emission elements, in other words, in the direction of the normal to the surface of the board can be changed into a direction parallel to the surface of the board, with the angles of inclination of the second recesses made larger than the critical angle θc for total reflection.

Considering the total reflection occurring on the boundary surfaces between atmosphere and the resin parts, the critical angle θc for total reflection is found by an equation (1) as follows.

$$n \cdot \sin \theta c = 1 \qquad (1)$$

In the equation (1), n is a refractive index of the resin, which index has a dependence on light wavelength in general. Therefore, consideration herein is given to a refractive index with respect to a center wavelength of light emitted from the light emission elements.

As for light from a typical blue light emission element at a wavelength of 455 nm, the refractive index n of typical highly refractive coating resin is on the order of 1.5. The critical angle θc for total reflection on the resin having the index n of 1.5 is roughly calculated at 42° according to the above equation.

FIGS. 13A and 13B are schematic diagrams showing tracks of light emitted from the light emission element in the axial direction (the direction of the normal to the surface of the board). In FIG. 13A, reference numeral 920 denotes the track of light emitted from the light emission element in the axial direction, and numeral 921 denotes the track of light traveling in the longitudinal direction inside the resin after undergoing total reflection on the interface between the resin and air. In FIG. 13B, reference numeral 930 denotes the track of light emitted from the light emission element in the axial direction, and numeral 931 denotes the track of light emitted into atmosphere after being refracted on the interface between the resin and air.

Specifically, FIG. 13A is the diagram showing the track of the light emitted from the light emission element in the axial direction (the direction of the normal to the surface of the board) in a configuration in which the angles θ of inclination of the surfaces of the second recess are steeper than the angle for total reflection, and FIG. 13B is the diagram showing the track of the light emitted from the light emission element in the axial direction (the direction of the normal to the surface of the board) in a configuration in which the angles θ of inclination of the surfaces of the second recess provide slanted surfaces gentler than the angle for total reflection.

Even if the angles of inclination satisfy a relation of θ<θc, as shown in FIG. 13B, intense light emitted from the light emission element in the axial direction is refracted on the slanted surface of the second recess and is thereby deviated from the direction of the normal to the surface of the board. Accordingly, luminous intensity of light emitted from regions corresponding to the light emission elements in the direction of the normal can be reduced.

Provided that the angles θ of inclination of the surfaces of the second recess are so large as to satisfy a relation of θ>θc, as shown in FIG. 13A, intense light emitted from the light emission element in the direction of the normal to the surface of the board undergoes total reflection on the slanted surfaces of the second recess so as to be deviated from the direction of the normal, as a matter of course, and so as to be guided in the resin part while having a progressive component in the longitudinal direction.

Therefore, the light guided while having the component in the longitudinal direction can finally and effectively be taken out from the first recesses and thus the uniformity in luminous intensity distribution on the line light source device with respect to the longitudinal direction can be made further excellent.

In one embodiment of the invention, the first recesses each have a plurality of protrusions or the first recesses each have a rough surface section having a surface finish rougher than that of the resin surface regions aligning with the light emission elements in the direction of the normal.

According to the embodiment, the first recesses each have the plurality of protrusions or the first recesses each have the rough surface section having the surface finish rougher than that of the resin surface regions aligning with the light emission elements in the direction of the normal. As a result, light can efficiently be taken out from sections having the plurality of protrusions or the rough surface sections in the first recesses and the uniformity in luminous intensity distribution on the line light source device with respect to the longitudinal direction can be made further excellent.

In one embodiment of the invention, the resin parts have fluorescent substance containing parts made of material containing fluorescent substance.

According to the embodiment, the resin parts have the fluorescent substance containing parts made of material containing fluorescent substance, and thus not only light having colors of the light source elements but light having any color can be emitted.

In one embodiment of the invention, the fluorescent substance containing parts are placed so as to enclose the light emission elements, and the fluorescent substance containing parts are spaced apart from the surfaces of the resin parts.

According to the embodiment, the fluorescent substance containing parts are placed so as to enclose the light emission elements, and are spaced apart from the surfaces of the resin parts. As a result, not only unevenness in luminance but unevenness in color can be suppressed. Especially, unevenness in color in vicinity of the light emission elements can be reduced.

In one embodiment of the invention, phosphor parts composed of phosphor or material containing phosphor are provided opposite to the board with respect to the resin parts in the direction of the normal.

According to the embodiment in which the phosphor parts are separately provided outside the resin parts, phosphor particles do not need to be provided inside the resin, and influence of scattering caused by phosphor particles inside the resin does not have to be considered. Therefore, in this embodiment, light intensities in the resin parts can be easily made uniform in comparison with a device in which separate phosphor part is not provided outside the resin parts. By using the excitation light source, of the light made generally uniform in intensity distribution in the light emission end face as an exiting light for the phosphor parts provided outside the resin parts, fluorescence having high uniformity in light intensity distribution can be obtained, and components of the exciting light having penetrated through and coming out of the phosphor parts have been scattered in the phosphor parts and have been improved in uniformity. As a result, not only unevenness in luminance but unevenness in color can be reduced.

In the conventional line light source device as shown in FIGS. 23A and 23B, for example, a luminous intensity profile in a longitudinal direction of a board has bright spots in regions where LEDs are placed as light emission elements, as shown in FIG. 14A. Even though light is made to penetrate a phosphor part provided opposite to the board with respect to a resin part as shown in FIG. 14C, therefore, merely pseudo white light is obtained in which traces of the bright spots intensely remain, e.g., as shown in FIG. 14B.

In the line light source device of the invention, by contrast, light having such a luminous intensity profile as shown in FIG. 15A, i.e., light having a luminous intensity distribution that is raised in the first recesses and generally uniform in the longitudinal direction is initially used as incident light. After the light is passed through the phosphor layer as shown in FIG. 15C, consequently, uniformity in luminous intensity distribution is further improved and such a luminous intensity distribution generally uniform in the longitudinal direction as shown in FIG. 15B can be obtained.

In one embodiment of the invention, the light emission end of each of the light emission elements with respect to the direction of the normal has a generally trapezoidal shape in a section in the longitudinal direction, and directions of normals to side surfaces of the end of the light emission element with respect to the longitudinal direction are slanted relative to the direction of the normal to the surface of the board.

According to the embodiment in which the directions of the normals to the side surfaces of the end of the light emission element are slanted relative to the direction of the normal to the surface of the board, light can be emitted in the directions of the normals of the side surfaces slanted by a specified angle relative to the top surface of the light emission element, so that light can be scattered in advance by the light emission element itself.

In one embodiment, sections of the resin parts and the board in a direction perpendicular to the longitudinal direction of the board are flush with each other and are mirror surfaces.

According to the embodiment, light with a large light quantity can be emitted.

In one embodiment of the invention, a plane light emission device comprises the above line light source device.

According to the embodiment, unevenness in both luminance and color in emitted light can be reduced.

In one embodiment of the invention, a liquid crystal display comprises the above plane light emission device.

According to the embodiment, unevenness in both luminance and color can be reduced.

There is also provided a plane light source device comprising:

a board, and a plurality of light emission element units placed in a predetermined two-dimensional pattern without a gap on a surface of the board, each of the plurality of light emission element units comprising:

a light emission element, and a resin part covering the light emission element, wherein in an imaginary cut surface that passes through centers of the plurality of light emission element units adjoining each other and that is perpendicular to the surface of the board, adjoining end parts of the resin parts of the adjoining light emission element units form first recesses.

According to the invention, difference in light quantity between light emitted from above the light emission elements and light emitted from above the first recesses can be reduced, so that light which is more uniform in surface density can be emitted.

In one embodiment of the invention, the resin parts of the plurality of light emission element units range integrally.

According to the embodiment, the resin parts can be easily configured.

In one embodiment of the invention, the resin parts of the plurality of light emission element units range integrally.

According to the embodiment, uniformity in surface density of emitted light can be further improved.

In one embodiment of the invention, the resin parts of the plurality of light emission element units have second recesses in regions that correspond to the light emission elements of the plurality of light emission element units in a direction of a normal to the board.

According to the embodiment, uniformity in surface density of emitted light can be further improved.

In one embodiment of the invention, the two-dimensional pattern is a grid-like pattern.

According to the embodiment, uniformity in surface density of emitted light can be further improved.

The line light source device of the invention has the board having the surface on which electrode patterns can be formed and which extends in the longitudinal direction, the plurality of light emission elements placed on the surface at some intervals along the longitudinal direction, and the resin parts that cover the plurality of light emission elements, and the surfaces of the resin parts opposite to the board have the first recesses between the adjoining light emission elements in the longitudinal direction. As a result, the uniformity in luminous intensity in the surface can be improved. A light emission surface of the device that emits light with high luminance resists producing bright lines and unevenness in color.

In the line light source device of the invention in which the first recesses exist between the adjoining light emission elements, thicknesses of the resin parts can be reduced between the adjoining light emission elements. Thus strain caused by thermal expansion and contraction between the adjoining light emission elements can be relaxed and stripping of the resin parts can be prevented in spite of the simple structure in which the light emission elements are coated with resin. In addition, facilitation of manufacture and reduction in manufacturing cost can be attained because of the simple structure in which the light emission elements are coated with resin.

In the line light source device of the invention, the uniformity of emitted light in the longitudinal direction can be further improved by the formation of the second recesses on the surfaces of the resin parts generally just above the light emission elements (positions generally corresponding to the elements in the direction of the normal to the surface of the board).

In the line light source device of the invention, the uniformity of emitted light in the longitudinal direction can be further improved by composition, with use of substance having high optical reflectivity, of the surfaces of the boards on which electrode patterns can be formed.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Figure 1A:
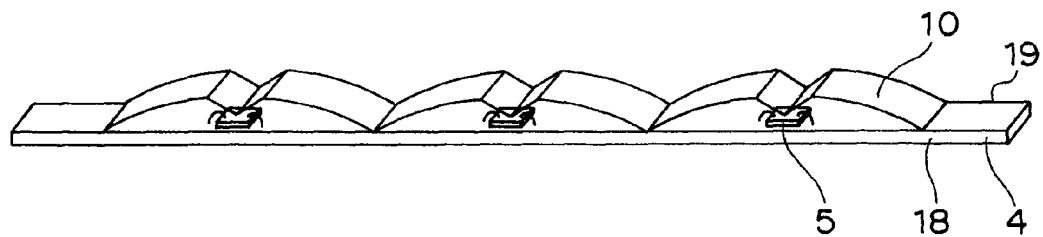
FIG. 1A is a perspective view of a line light source device in accordance with a first embodiment of the invention.

Hereinbelow, the invention will be described in detail with reference to embodiments shown in the drawings.

First Embodiment

Figure 1B:
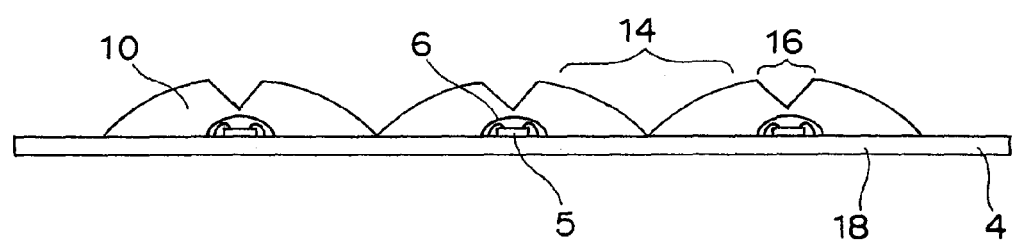
FIG. 1B is a longitudinal section of the line light source device of the first embodiment.
Figure 1C:
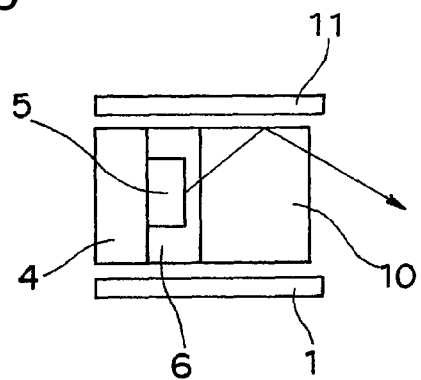
FIG. 1C is a section of a printed board, the section taken through a light emission element along a direction of width of a printed board.

FIG. 1A is a perspective view of a line light source device in accordance with a first embodiment of the invention, and FIG. 1B is a longitudinal section of the line light source device of the first embodiment. FIG. 1C is a section of a printed board 4, the section taken through a light emission element 5 along a direction of width of the printed board.

As shown in FIGS. 1A, 1B and 1C, the line light source device is composed of the printed board 4 that is provided as a circuit board and that is shaped like an elongated thin strip, a plurality of light emission elements 5, transparent sealing resin layers 6 having phosphor, as an example of fluorescent substance containing parts, transparent sealing resin layers 10 substantially free of phosphor, a lower reflection sheet 1, and an upper reflection sheet 11, as reflection members.

As shown in FIG. 1B, the plurality of light emission element 5 are placed in a row on one surface of the printed board 4, at some intervals along a longitudinal direction of the printed board 4. The sealing resin layers 6 are formed so as to enclose the light emission elements 5 on the printed board 4. On the other hand, the sealing resin layers 10 are formed so as to enclose the sealing resin layers 6. The sealing resin layers 6 coating the light emission elements 5 and the sealing resin layers 10 enclosing the sealing resin parts 6 form resin parts.

As shown in FIG. 1C, the lower reflection sheet 1 is affixed onto end faces of the sealing resin layers 10 on one side with respect to a direction of width thereof (correctly, the direction of width of the printed board 4). On the other hand, the upper reflection sheet 11 is affixed onto end faces of the sealing resin layers 10 on the other side with respect to the direction of width thereof.

As shown in FIG. 1A, the printed board 4 is formed by dicing cut of a printed board material 40 (see FIG. 2A that will be described below), rectangular in plan view, into elongated square bars. On the upper surface (mounting surface) of the printed board 4, the plurality of light emission element 5 are placed in a row at the specified intervals along the longitudinal direction of the printed board 4 shaped like the elongated thin strip. In vicinity of both ends of the printed board 4 with respect to the direction of width exist a positive electrode terminal and a negative electrode terminal (not shown). The positive electrode terminal and the negative electrode terminal are electrically connected to the light emission elements 5. Electric power is supplied to the light emission elements 5 through the positive electrode terminal and the negative electrode terminal.

For the light emission elements 5 is used GaN-based compound semiconductor, for example. The light emission elements 5 are each formed by stacking of an n-type layer and a p-type layer on a transparent sapphire board, formation of an n-type electrode or a p-type electrode on a surface of each of the n-type layer and the p-type layer, and die bonding both the electrodes onto an interconnection pattern on the printed board 4 using wires. The line light source device is formed by coating of the light emission elements 5 with transparent resin containing phosphor and electrical serial connection of the light emission elements 5.

The transparent sealing resin layers 6 containing phosphor are formed by application, on surfaces of the light emission elements 5, of silicone resin in which yellow phosphor is dispersed as the phosphor, for example.

The transparent sealing resin layers 10 are formed by injection of, e.g., silicone resin into a region surrounded by the printed board 4, the transparent sealing resin layers 6 containing phosphor, and a forming die 28 (see FIG. 2E) and by hardening of the resin.

As shown in FIG. 1A, the transparent sealing resin layers 10 substantially free of phosphor each extend longitudinally on both sides of and within a given distance from the corresponding light emission element 5 with the element being at center of the layer. In a longitudinal section, the sealing resin layers 10 each have two surfaces shaped like an arch. Specifically, the sealing resin layers 10 each have a first convex surface 300 joining the surface of the printed board 4 at one longitudinal end of the layer and a second convex surface 301 joining the surface of the printed board 4 at the other longitudinal end of the layer.

The first convex surface 300 and the second convex surface 301 are generally in plane symmetry with respect to a plane extending through a longitudinal center of the light emission element 5 in a direction of a normal to the surface of the printed board 4. The first convex surface 300 and the second convex surface 301 join each other through surfaces 302 having a shape of a letter V (formed of two flat surfaces connected to each other) in a longitudinal section. A bend between the surfaces 302 having the V-shaped section faces the longitudinal center of the light emission element 5 in the direction of the normal.

As shown in FIG. 1A, the sealing resin layers 10 each have a portion defined by the first convex surface 300 and the printed board 4 with respect to the direction of the normal. Thickness of the portion in the direction of the normal gradually increases from one end in the longitudinal direction toward the other end at the surfaces having the V-shaped section.

On the other hand, the sealing resin layers 10 each have a portion defined by the second convex surface 301 and the printed board 4 in the direction of the normal. Thickness of the portion in the direction of the normal becomes larger (gradually increases) from the other end in the longitudinal direction toward an end at the surfaces having the V-shaped section.

As shown in FIG. 1B, one longitudinal end of a sealing resin part 10 coincides with the other longitudinal end of the adjoining sealing resin part 10. The other longitudinal end of the sealing resin part 10 coincides with one longitudinal end of the adjoining sealing resin part 10.

As shown in FIG. 1B, a surface of the line light source device is shaped so that a first recess 14 defined by a connection of the two convex surfaces 300, 301 and a second recess 16 defined by the surfaces having the V-shaped section are alternately repeated in the longitudinal direction of the printed board 4. The first recess 14 is positioned between the light emission elements 5 adjoining in the longitudinal direction and the second recess 16, which has the section generally shaped like the letter V, is positioned just above the light emission element 5 in general.

As described in detail in SUMMARY OF THE INVENTION, light having sufficient luminance can be emitted from regions between the light emission elements 5 that tend to be poor in luminance in conventional devices and uniformity in luminance of the line light source device with respect to the longitudinal direction can be made excellent, on basis of phenomena in which a portion of light that is emitted generally in the direction of the normal from light source areas composed of the light emission elements 5 and the transparent sealing resin layers 6 containing phosphor undergoes total reflection on the second recesses 16, in which a portion of light that is emitted therefrom with tilt relative to the direction of the normal undergoes total reflection on the first and second convex surfaces (shaped like a gentle arch) 300, 301, in which the portions of light having undergone the total reflection are efficiently guided to and condensed on the first recesses 14 with aid of the gently arched shape, and in which the condensed light is efficiently emitted from the first recesses 14.

Optimal conditions by means of the shapes of the gentle arch, the first recess 14, and the second recess 16 for eliminating unevenness in the luminance are changed in accordance with a combination of a refractive index of resin in use, light distribution characteristics of the light emission elements 5, and the intervals of placement of the light emission elements 5. Conversely, the shapes can appropriately be adjusted so as to be preferable to the conditions.

In the first embodiment, the sealing resin layers 10 each gently decrease in thickness with longitudinal distance from the corresponding light emission element 5, except a longitudinal center part of the sealing resin layers 10. In the first embodiment, a surface of each sealing resin layer 10 shown in FIG. 1B has a gently arched shape protruding upward, except the longitudinal center part of the sealing resin layer 10.

The sealing resin layers 10 are required to be cut so that the surfaces of the layers 10 are mirror-finished and have an improved reflection efficiency. Roughened surfaces of the sealing resin layers 10 might cause irregular light reflection and thus might make it impossible to sufficiently control the light intensity distribution. That is, effects of light control on the second recesses 16 and the first recesses 14 might be reduced and the uniformity in the light intensity distribution might be deteriorated. Accordingly, sufficient attention is required on the mirror finish of the surfaces of the sealing resin layers 10.

The reflection sheets 1 and 11 extend in the direction of the normal to the mounting surface of the printed board 4. The reflection sheets 1 and 11 are mirror-surface-like tapes or tape-shaped members having a high optical reflectance, such as white ones. The reflection sheets 1 and 11 cover areas from end faces 18, 19 of the printed board 4, which adjoin the mounting surface and extend in the direction of the normal to the printed board 4, to the surfaces of the sealing resin layers 10. Thus light radiated upward and downward from the light emission elements 5 (see FIG. 1C) is thoroughly reflected by both the reflection sheets 1 and 11, condensed frontward, and emitted linearly.

Hereinbelow will be described function of the line light source device. When power is supplied to the light emission elements 5 through the interconnection pattern on the printed board 4, light is emitted from active layers of the semiconductor layers in the light emission elements 5. The light from the active layers is radially emitted from main light output surfaces of the light emission elements 5, that is, surfaces of electrode on which the wires 9 (see FIG. 2B) have been die-bonded.

Light in upward and downward directions (directions of the normal to the end face 18 (see FIG. 1A)) out of the light emitted from the light emission elements 5 is reflected by the reflection sheets 1, 11 and advanced frontward. Out of the frontward light incident on the second recesses 16, a portion satisfying a condition is reflected with total reflection, while the remaining portion is emitted after being refracted on the surfaces of the resin. Out of the light incident on the gently arched parts, a portion satisfying a condition is reflected with total reflection, and the remaining portion is emitted after being refracted on the surfaces of the resin.

Most of the light undergoing the total reflection and of light radiated in the longitudinal directions of the line light source device is guided in the longitudinal directions to vicinity of the first recesses 14 and is condensed, so that the condensed light is finally emitted from the first recesses 14.

The rays of light emitted from the first recesses 14 are spread with a wider angle in general than rays of light directly emitted from the light emission elements 5. Such spread of the rays of light emitted from the first recesses 14 results in compensation for luminances between the light emission elements 5 and leads to the uniformity in luminance.

FIGS. 2A through 2I are diagrams illustrating a method of manufacturing the line light source device of the embodiment.

Figure 2A:
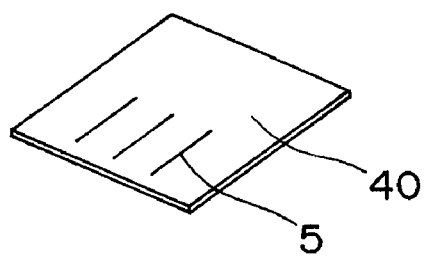
FIG. 2A is a diagram illustrating a method of manufacturing the line light source device of the first embodiment.
Figure 2B:
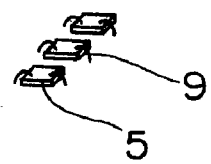
FIG. 2B is a diagram illustrating a method of manufacturing the line light source device of the first embodiment.
Figure 2C:
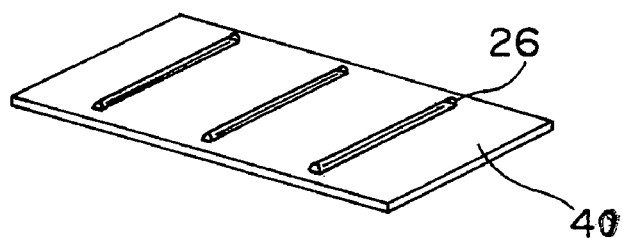
FIG. 2C is a diagram illustrating a method of manufacturing the line light source device of the first embodiment.
Figure 2D:
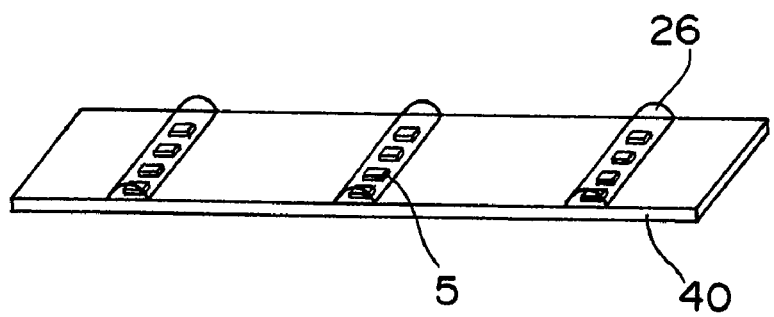
FIG. 2D is a diagram illustrating a method of manufacturing the line light source device of the first embodiment.
Figure 2E:
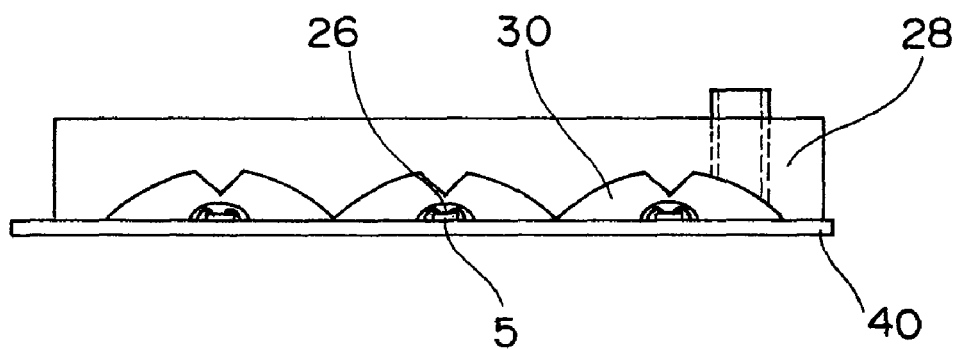
FIG. 2E is a diagram illustrating a method of manufacturing the line light source device of the first embodiment.
Figure 2F:
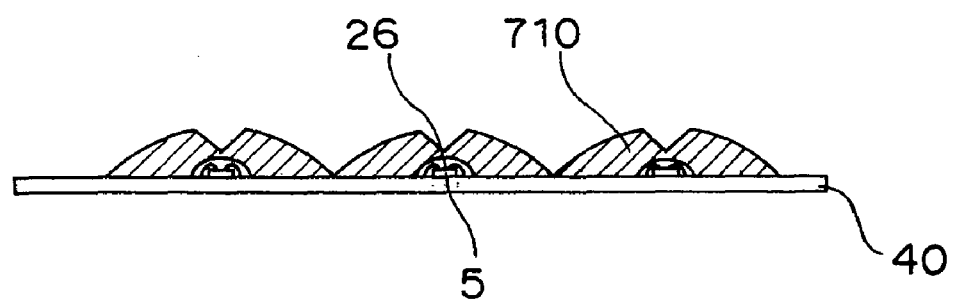
FIG. 2F is a diagram illustrating a method of manufacturing the line light source device of the first embodiment.
Figure 2G:
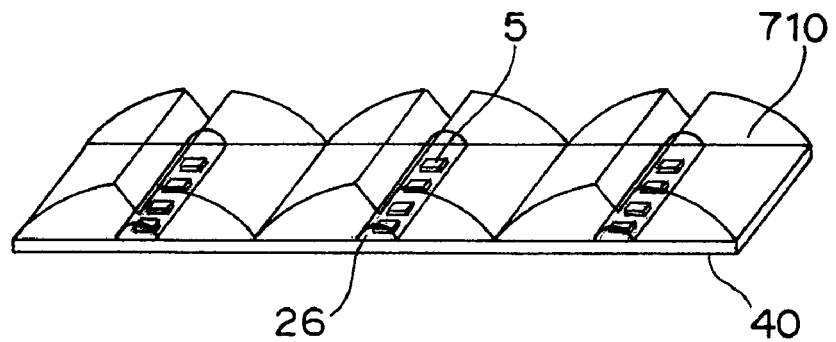
FIG. 2G is a diagram illustrating a method of manufacturing the line light source device of the first embodiment.
Figure 2H:
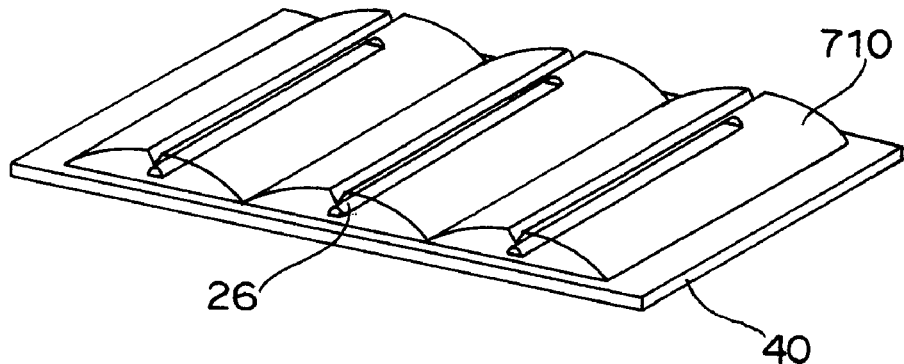
FIG. 2H is a diagram illustrating a method of manufacturing the line light source device of the first embodiment.

Specifically, FIG. 2A is a perspective view in which a plurality of light emission elements have been placed on a circuit board, and FIG. 2B is a perspective view in which the light emission elements have undergone the die bonding. FIGS. 2C and 2D are perspective views in which the light emission elements have been coated with resin containing phosphor, and FIG. 2E is a section in which the components shown in FIGS. 2C and 2D have been covered with the die. FIG. 2F is a schematic diagram showing a state in which resin injected into the die denoted by reference numeral 28 in FIG. 2E has been hardened. FIG. 2G is a perspective view showing a state in which the resin injected in a configuration of FIG. 2E has been hardened and showing sealing resin layers 710 that have portions having arch-like sections shown in FIG. 2F, as seen looking diagonally. FIG. 2H is a perspective view showing a state in which dicing is to be performed.

The line light source device of this embodiment is manufactured as follows, for example. Initially, a conductive pattern is formed on, e.g., a white glass BT (bismaleimide triazine) copper-clad laminated board.

As shown in FIG. 2A, subsequently, the light emission elements 5 are arranged on a mounting surface of the printed board material 40 quadrangular in plan view and are mechanically fixed thereto by adhesive. As shown in FIG. 2B, the light emission elements 5 are thereafter subjected to the die bonding so that a structure is formed in which the light emission elements 5 are powered from outside. As shown in FIGS. 2C and 2D, transparent resin containing phosphor is subsequently applied along rows of the light emission elements 5 so as to form semicylindrical transparent resin layers 26 containing phosphor.

A specified amount of the transparent resin containing phosphor is dispensed from a dispenser moving along the rows of the light emission elements 5 and the resin layers 26 arranged like lines are thereby formed. Thus the semicylindrical transparent resin layers 26 containing phosphor are formed.

On condition that the amount of the resin dispensed from the dispenser is small, shapes in which the resin layers 26 are applied become inconstant under influence of a shape of the light emission elements 5 placed on the printed board material 40 and of surface tensions on the wires 9 used in the die bonding, on occasion of the formation of the resin layers 26. The inconstancy of the shapes of application might become a principal factor of variation in chromaticity of the line light source device completed finally. Therefore, it is necessary and indispensable to dispense the resin in an necessity minimum amount that results in as small influence as possible of the shape of the light emission elements 5 formed on the printed board material 40 and of the surface tensions on the wires 9 used in the die bonding and to thereby form the resin layers 26 ranging uniformly.

On condition that the semicylindrical transparent resin layers 26 containing phosphor are formed with a dispensing amount of the resin from the dispenser which largely exceeds the necessity minimum dispensing amount that results in no influence of the surface tensions, sizes of light sources greatly differ between the light emission elements 5 as light sources and the phosphor as light sources that emit fluorescence. In this case, it is remarkably difficult to simultaneously control directional characteristics of light rays having two different wavelengths with use of the same arched shape of the resin (sealing resin layers corresponding to the sealing resin layers designated by numeral 10 in FIG. 1).

In order to avoid this difficulty, as in the first embodiment, it is necessary to form the semicylindrical transparent resin layers 26 containing phosphor with the necessity minimum dispensing amount that results in as little influence as possible of the surface tensions and to make the size of the area in which the phosphor as light source resides as close as possible to the size of the area in which the light emission elements 5 reside.

As shown in FIG. 2E, subsequently, the printed board material 40 and the semicylindrical transparent resin layers 26 containing phosphor are enclosed by the forming die 28 so that a molding resin injection space 30 is prepared.

After that, the molding resin injection space prepared in FIG. 2E is filled with transparent resin free of phosphor, which is then hardened and molded, and the die is thereafter released from the hardened and molded resin, so that the sealing resin layers 710 shown in FIGS. 2F and 2G and shaped like arches are formed.

Figure 2I:
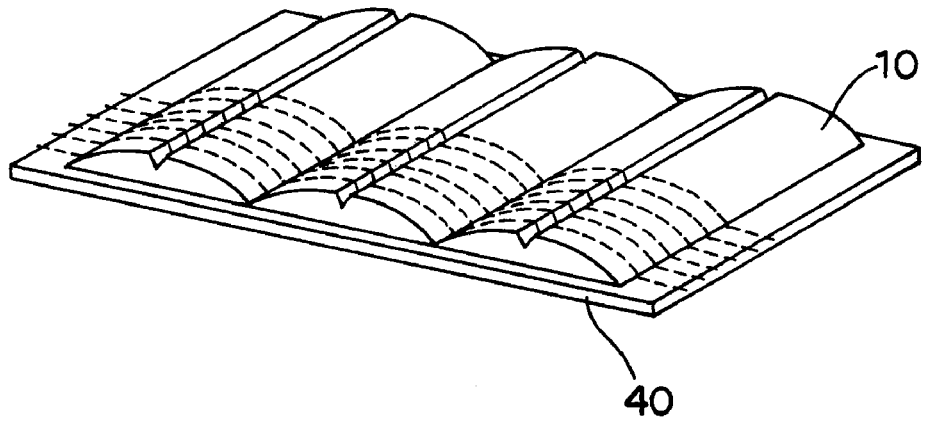
FIG. 2I is a diagram illustrating a method of manufacturing the line light source device of the first embodiment.

As shown in FIGS. 2H and 2I, subsequently, the printed board material 40 quadrangular in plan view is cut by dicing into the plurality of line light source devices on the manufacturing way so that the devices are shaped like elongated thin strips in plan view. In the dicing, cut surfaces of the resin can be made into mirror state by appropriate selection of a grain size, a rotation speed, and a cutting speed of a blade.

The areas from the end faces (upper and lower faces) 18, 19 adjoining the mounting surface of the printed board 4 (see FIG. 1) to extremities of the arched sealing resin layers 10 are covered with the reflection sheets 1 and 11. In this manner, the line light source device shown in FIGS. 1A through 1C is manufactured.

Figure 3:
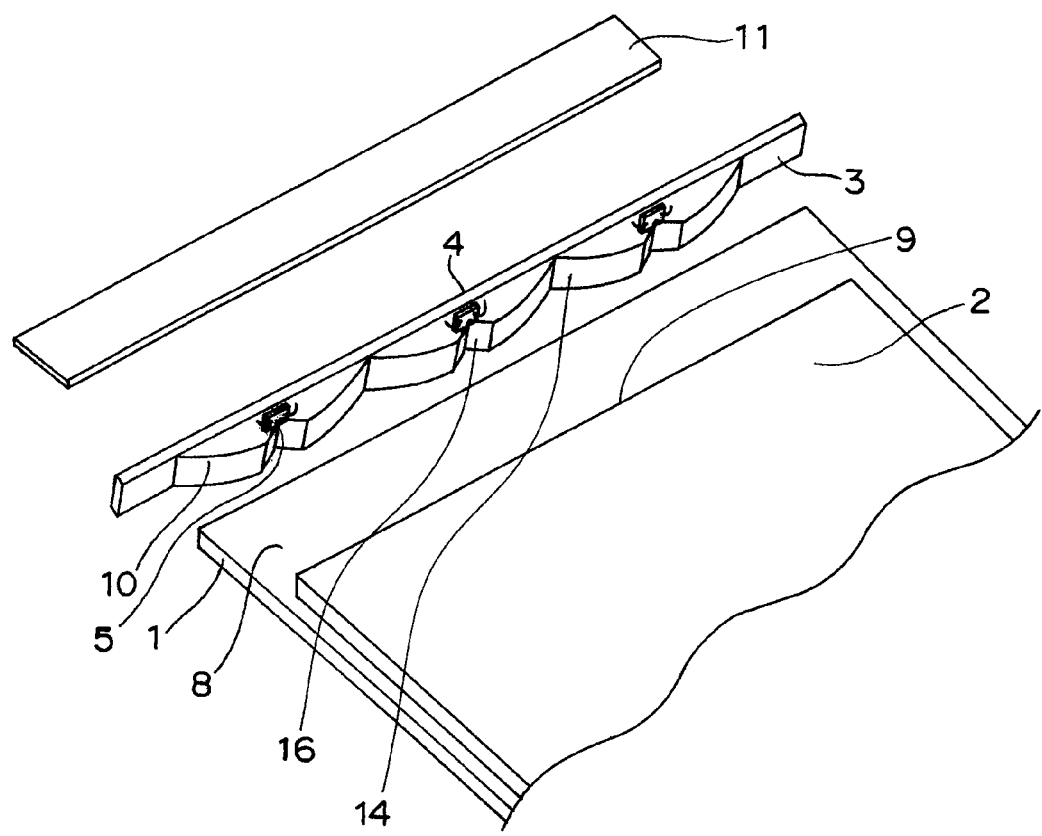
FIG. 3 is a perspective view of a plane light emission device of the invention that is produced with use of the line light source device of the invention.
Figure 4:
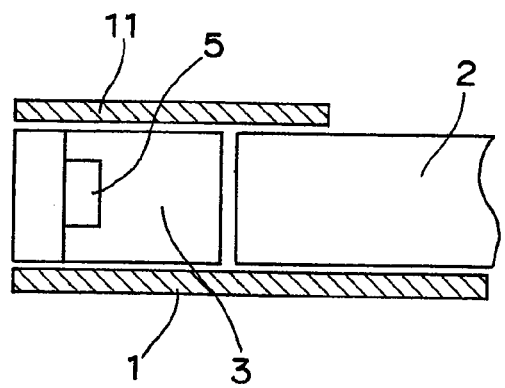
FIG. 4 is a longitudinal section showing a region where the light emission element 5 is mounted, along with a mounting structure of a light guide plate 2 and the printed board 4.

FIG. 3 is a perspective view of a plane light emission device of the invention that is produced with use of the line light source device of the invention. FIG. 4 is a longitudinal section showing a region where the light emission element 5 is mounted, along with a mounting structure of a light guide plate 2 and the printed board 4.

Components in FIGS. 3 and 4 that are identical to or correspond to the components shown in FIGS. 1 and 2 are designated by the same reference numerals and description thereof is omitted.

As shown in FIGS. 3 and 4, the plane light emission device has a lower reflection sheet 1 shaped like a rectangle in plan view, a flat-plate-like light guide plate 2 affixed onto an upper surface of the lower reflection sheet 1 except one end, the line light source 3 placed on the one end of the lower reflection sheet 1 and along a side surface 9 of the light guide plate 2, and an upper reflection sheet 11 that is shaped like an elongated strip and that is mounted so as to cover upper surfaces of the line light source 3 and the light guide plate 2, i.e., an end part (upper side) of a light emission surface.

The lower reflection sheet 1 is composed of a mirror-surface-like tape or a tape-like member having a high optical reflectance, such as white one. The lower reflection sheet 1 covers an area ranging from the light guide plate 2 to the printed board 4, correctly, from one of reflection surfaces of the light guide plate 2 to a lower face of the printed board 4. Accordingly, light emitted downward from the line light source 3 is reflected by the lower reflection sheet 1 into the light guide plate 2.

The light guide plate 2 is a 0.2 to 1.0 mm thick transparent plate made of acrylic resin, polycarbonate resin or the like, for example. The plane light emission device forms a part of a liquid crystal display, and a liquid crystal display panel (not shown) is placed over the light guide plate 2. More specifically, the liquid crystal panel is placed over the light guide plate 2 with a lower surface of the panel extending along the upper surface of the light guide plate 2.

Provided that a thickness of the line light source 3 is larger than that of the light guide plate 2, a light capturing port of the light guide plate 2 may be spread toward its end face in shape of a funnel with varying the thickness, so as to attain coincidence between the thickness of the line light source and that of the light guide plate 2 at the end face.

The line light source 3 is installed so that the longitudinal axis of the line light source device of the embodiment faces parallel to the side surface 9 of the light guide plate 2.

A shape of the side surface of the light guide plate facing the line light source (a surface corresponding to the surface designated by numeral 9 in FIG. 3) may be uneven so as to fit the arched shape of the resin. By such a configuration, an efficiency of optical coupling between the light source and the light guide plate can be improved.

For the upper reflection sheet 11 is used the same material as that for the lower reflection sheet 1. The upper reflection sheet 11 covers a region ranging from the end part of the light guide plate 2 to the printed board 4, on upper side of the line light source device. That is, the upper reflection sheet 11 covers the end part of the light guide plate 2 close to the light emission elements 5, top of the light emission elements 5, and the upper face of the printed board 4.

Thus light emitted upward and downward from the light emission elements 5 can be reflected by the lower and upper reflection sheets 1 and 11 without leak of the light from gaps between the light guide plate 2 and the line light source 3. Therefore, the light from the light emission elements 5 can thoroughly be projected into the light guide plate 2.

With the shapes of the first recesses 14 and the second recesses 16 on the arched sealing resin layers 10 adjusted appropriately, the line light source 3 in the planar light source device is capable of emitting light with sufficient luminance, whatever specifications the device has, even from the intermediate regions between the light emission elements 5 which regions tend to be poor in luminance, so that the uniformity in luminance of the line light source with respect to the longitudinal direction can be improved.

In the device in which plane emission from the light guide plate 2 is carried out with light from the light source 3 introduced through the end face 9 of the light guide plate 2 into the light guide plate 2, therefore, luminance distribution on the emission surface can be made generally uniform.

It is needless to say that optimal conditions for uniform luminance distribution on the surface vary with a combination of refractive index of resin used in the line light source 3, light distribution characteristics of the light emission elements 5, and intervals of placement of the light emission elements 5 and with shape of the light guide plate 2 in use.

Accordingly, detailed shapes of the first recesses 14 and the second recesses 16 on the sealing resin layers 10 having the arched surfaces in the line light source 3 are required to be adjusted appropriately, so as to attain uniform luminance distribution in the emission surface.

In the line light source device of the first embodiment, as described above, the plurality of light emission element 5 are placed on the generally rectangular surface of the printed board 4 having the electrode patterns formed thereon, along the longitudinal direction of the board, and the thickness of resin covering each light emission element 5 gently decreases with longitudinal distance from the light emission element 5. There are formed parts having substantially no resin, in the intermediate sections between the adjoining light emission elements, and the recesses are formed on the resin parts 10 just above the light emission elements 5 in general. Further, the resin layers 6 mixed with phosphor are provided in vicinity of the light emission elements 5.

In the line light source device of the first embodiment, linear light rarely having unevenness in luminance, bright lines, and unevenness in chromaticity can be emitted from the device even when the light is emitted with a desired color and a high luminance, and the resin can be prevented from being stripped from the printed board.

Second Embodiment

Figure 5A:
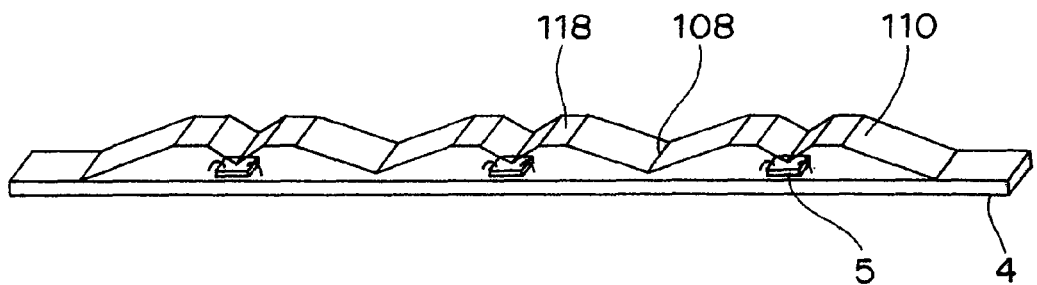
FIG. 5A is a perspective view of a line light source device in accordance with a second embodiment of the invention.
Figure 5B:
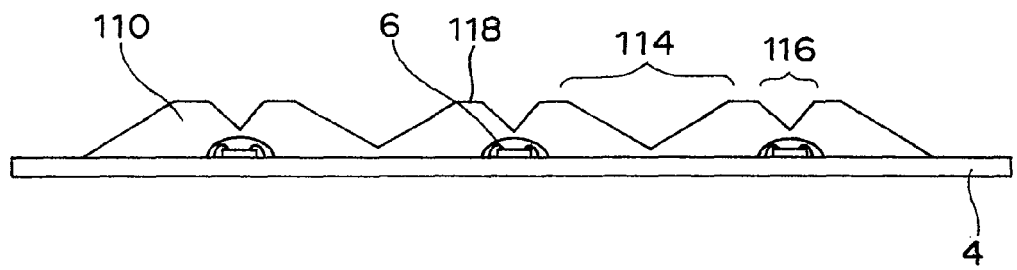
FIG. 5B is a longitudinal section of the line light source device of the second embodiment.
Figure 5C:
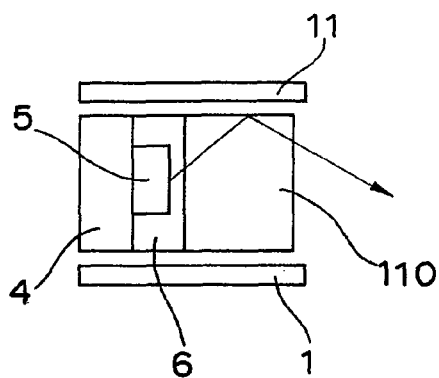
FIG. 5C is a section of the printed board on which reflection sheets are provided, the section taken through a light emission element along a direction of width of the printed board.

FIG. 5A is a perspective view of a line light source device in accordance with a second embodiment of the invention, and FIG. 5B is a longitudinal section of the line light source device of the second embodiment. FIG. 5C is a section of a printed board, the section taken through a light emission element 5 having reflection sheets along a direction of width of the printed board.

Components of the line light source device of the second embodiment that are the same as the components of the line light source device of the first embodiment are designated by the same reference numerals and description thereof is omitted. For the line light source device of the second embodiment, description is omitted on functional effects and modifications that are common to those of the line light source device of the first embodiment but is provided only on configurations, functional effects, and modifications that are different from those of the line light source device of the first embodiment.

In the second embodiment, the plurality of light emission elements 5 are placed at given intervals along the longitudinal direction of the generally planar long printed board 4 having electrode patterns formed thereon.

Also, sealing resin layers 110 are formed so as to cover the light emission elements 5. The sealing resin layers 110 each have a shape that is generally in plane symmetry with respect to a plane extending through center of the light emission element 5 and including the direction of width of the board 4 and a direction of a normal to a surface of the board 4.

As shown in FIGS. 5A and 5B, a section of the sealing resin layer 110 taken in the longitudinal direction of the board 4 is in shape of an isosceles trapezoid from which a portion at center of an upper side of the trapezoid is cut out so as to form a section shaped like a letter V. That is, there is a recess having the V-shaped section generally just above each light emission element 5 in the sealing resin layers 110. As shown in FIGS. 5A and 5B, furthermore, there are portions 108 smallest in resin thickness on borders between the adjoining sealing resin layers 110.

As shown in FIG. 5B, resin layers 6 mixed with phosphor are provided in vicinity of the light emission elements 5. Thus the line light source can be obtained that rarely has unevenness in luminance, bright lines, and unevenness in chromaticity even when light is emitted with a desired color and a high luminance.

In the sealing resin layers 110 of the second embodiment, as shown in FIG. 5B, the first recesses 114 having the V-shaped section and residing between the adjoining light emission elements 5 and the second recesses 116 having the V-shaped section and residing just above the light emission elements 5 are linked through planar surfaces 118 generally parallel to the surface of the board 4. There can be attained functional effects generally similar to those of the first embodiment by the sealing resin layers 110 having not only portions of which thickness gently decreases with longitudinal distance from the light emission elements 5, but also the portion of the planar surfaces 118 generally parallel to the surface of the board 4.

Third Embodiment

Figure 6A:
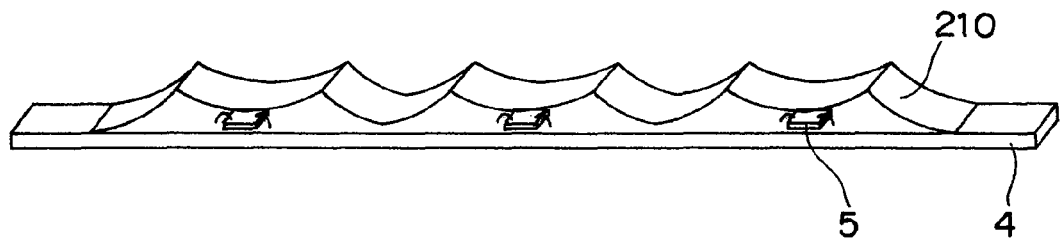
FIG. 6A is a perspective view of a line light source device in accordance with a third embodiment of the invention.
Figure 6B:
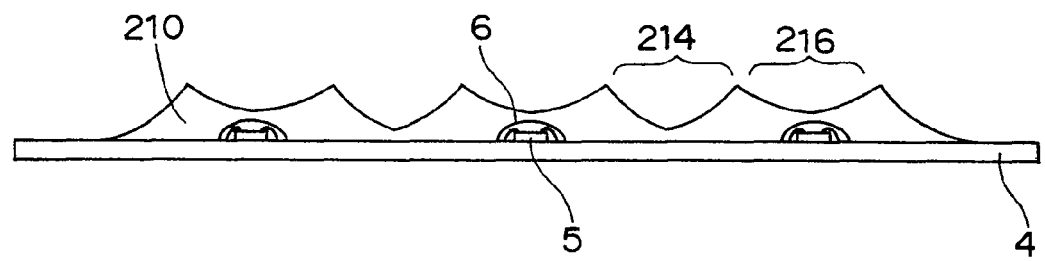
FIG. 6B is a longitudinal section of the line light source device of the third embodiment.
Figure 6C:
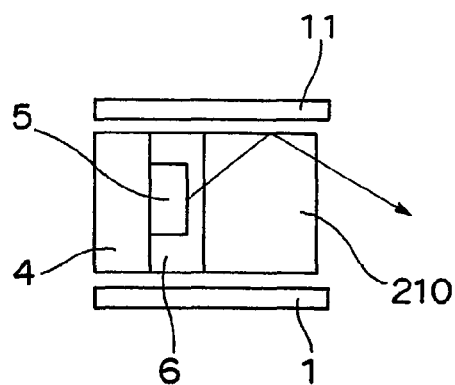
FIG. 6C is a section of a printed board on which reflection sheets are provided, the section taken through a light emission element along a direction of width of the printed board.

FIG. 6A is a perspective view of a line light source device in accordance with a third embodiment of the invention, and FIG. 6B is a longitudinal section of the line light source device of the third embodiment. FIG. 6C is a section of a printed board, the section taken through a light emission element 5 having reflection sheets along a direction of width of the printed board.

Components of the line light source device of the third embodiment that are the same as the components of the line light source device of the first embodiment are designated by the same reference numerals and description thereof is omitted. For the line light source device of the third embodiment, description is omitted on functional effects and modifications that are common to those of the line light source device of the first embodiment but is provided only on configurations, functional effects, and modifications that are different from those of the line light source device of the first embodiment.

In the third embodiment, as shown in FIGS. 6A and 6B, the plurality of light emission element 5 are placed at given intervals along the longitudinal direction of the generally planar long printed board 4 having electrode patterns formed thereon.

Also, a sealing resin layer 210 is formed so as to cover the light emission elements 5. A surface of the sealing resin layer 210 includes recessed surfaces 214 each having a section generally shaped like a circular arc, between the adjoining light emission elements 5. Each recessed surface 214 is generally in plane symmetry with respect to a plane extending through a midpoint between the adjoining light emission elements 5 and including a direction of a normal to a surface of the printed board 4 and the direction of width of the board 4. The recessed surfaces 214 form first recesses.

The surface of the sealing resin layer 210 includes recessed surfaces 216 just above the light emission elements 5. The recessed surfaces 216 just above the light emission elements 5 each have a shape that is generally in plane symmetry with respect to a plane extending through center of the light emission element 5 and including the direction of width of the printed board 4 and the direction of the normal to the surface of the printed board 4. The recessed surfaces 216 form second recesses.

In the longitudinal direction of the board 4, the recessed surfaces 216 join the recessed surfaces 214 between the adjoining light emission elements 5. A shortest distance between the recessed surfaces 216 just above the light emission elements 5 and the surface of the board 4 is larger than a shortest distance between the recessed surfaces 214 between the adjoining light emission elements 5 and the surface of the board 4. The first recesses 214 and the second recesses 216 have shapes protruding downward.

Fourth Embodiment

Figure 7A:
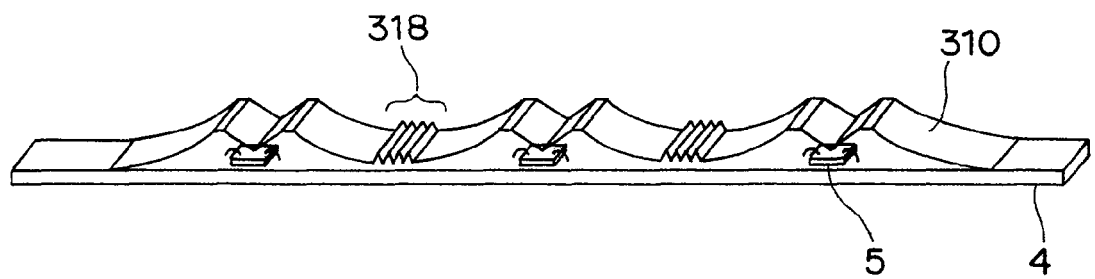
FIG. 7A is a perspective view of a line light source device in accordance with a fourth embodiment of the invention.
Figure 7B:
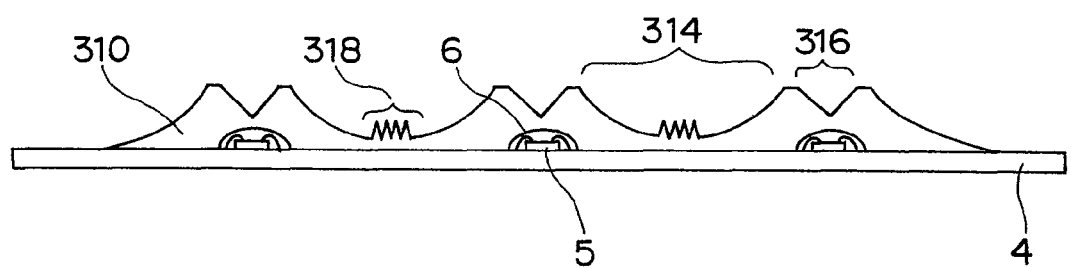
FIG. 7B is a longitudinal section of the line light source device of the fourth embodiment.
Figure 7C:
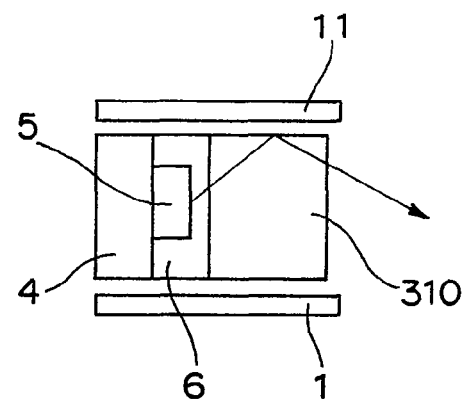
FIG. 7C is a section of a printed board on which reflection sheets are provided, the section taken through a light emission element along a direction of width of the printed board.

FIG. 7A is a perspective view of a line light source device in accordance with a fourth embodiment of the invention, and FIG. 7B is a longitudinal section of the line light source device of the fourth embodiment. FIG. 7C is a section of a printed board, the section taken through a light emission element 5 along a direction of width of the printed board having reflection sheets.

Components of the line light source device of the fourth embodiment that are the same as the components of the line light source device of the first embodiment are designated by the same reference numerals and description thereof is omitted. For the line light source device of the fourth embodiment, description is omitted on functional effects and modifications that are common to those of the line light source device of the first embodiment but is provided only on configurations, functional effects, and modifications that are different from those of the line light source device of the first embodiment.

In the fourth embodiment, as shown in FIGS. 7A and 7B, the plurality of light emission element 5 are placed at given intervals along the longitudinal direction of the generally planar long printed board 4 having electrode patterns formed thereon.

Also, a sealing resin layer 310 is formed so as to cover the light emission elements 5. A surface of the sealing resin layer 310 opposite to the board 4 includes first recesses 314 of which major portions are recessed surfaces each having a section generally shaped like a circular arc, between the adjoining light emission elements 5. The surface of the sealing resin layer 310 opposite to the board 4 also includes second recesses 316, each having a section shaped like a letter V, right above the light emission elements 5.

The first recess 314 is generally in plane symmetry with respect to a plane extending through a midpoint between the adjoining light emission elements 5 and including a direction of a normal to a surface of the printed board 4 and the direction of width of the board 4. The second recesses 316 each have a shape that is generally in plane symmetry with respect to a plane extending through center of the light emission element 5 and including the direction of width of the board 4 and the direction of the normal to the surface of the board 4.

The first recesses 314 each have a plurality of protrusions 318 that are triangular in section and that protrude radially outward from the recessed surface, on longitudinal center part of the first recess 314. The plurality of protrusions 318 are placed without longitudinal intervals along the longitudinal direction. That is, a longitudinal end of one of the adjoining protrusions 318 and a longitudinal end of the other are directly linked to each other. The plurality of protrusions 318 are formed by molding with use of a die that has undergone V-groove machining with a pitch of several hundred micrometers. The protrusions 318 extend in the widthwise direction of the board 4.

In the fourth embodiment, light that has been guided in the longitudinal direction to vicinity of the first recesses 314 and has been condensed can be scattered by the protrusions 318. Thus the light can efficiently be emitted.

Fifth Embodiment

Figure 8A:
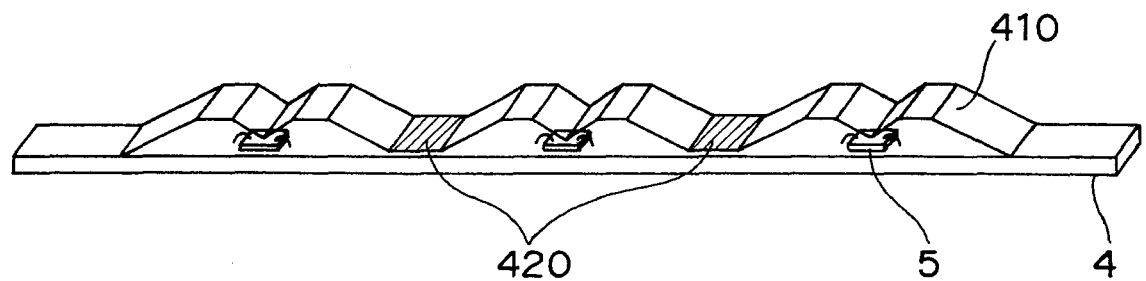
FIG. 8A is a perspective view of a line light source device in accordance with a fifth embodiment of the invention.
Figure 8B:
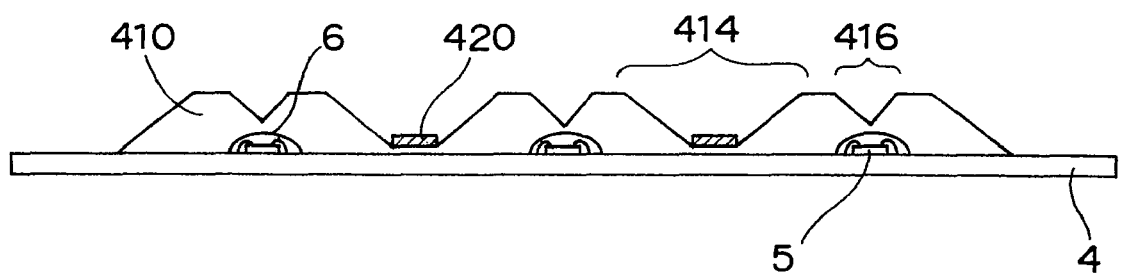
FIG. 8B is a longitudinal section of the line light source device of the fifth embodiment.
Figure 8C:
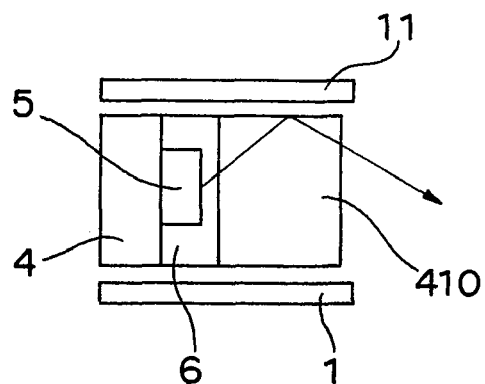
FIG. 8C is a section of a printed board on which reflection sheets are provided, the section taken through a light emission element along a direction of width of the printed board.

FIG. 8A is a perspective view of a line light source device in accordance with a fifth embodiment of the invention, and FIG. 8B is a longitudinal section of the line light source device of the fifth embodiment. FIG. 8C is a section of a board, the section taken through a light emission element 5 along a direction of width of the printed board having reflection sheets.

Components of the line light source device of the fifth embodiment that are the same as the components of the line light source device of the first embodiment are designated by the same reference numerals and description thereof is omitted. For the line light source device of the fifth embodiment, description is omitted on functional effects and modifications that are common to those of the line light source device of the first embodiment but is provided only on configurations, functional effects, and modifications that are different from those of the line light source device of the first embodiment.

In the fifth embodiment, as shown in FIGS. 8A and 8B, the plurality of light emission element 5 are placed at given intervals along the longitudinal direction of the generally planar long printed board 4 having electrode patterns formed thereon.

Also, a sealing resin layer 410 is formed so as to cover the light emission elements 5. First recesses 414 located intermediate between adjacent light emission elements 5 in the sealing resin layer 410 each have a shape that is generally in plane symmetry with respect to a plane extending through center of the light emission element 5 and including the direction of width of the board 4 and a direction of a normal to a surface of the board 4.

As shown in FIGS. 8A and 8B, a section of a part of the sealing resin layer 410 surrounding each light emission element 5 which section is taken along the longitudinal direction of the board 4 is in shape of an isosceles trapezoid from which a portion at center of an upper side of the trapezoid is cut out so as to form a section shaped like a letter V. There is a second recess 416 having the V-shaped section generally just above each light emission element 5 in the sealing resin layer 410.

As shown in FIGS. 8A and 8B, there are portions smallest in resin thickness on intermediate sections between the adjoining light emission elements 5.

A configuration formed of the isosceles trapezoid from which the portion thereof has been cut off is connected, through a planar surface section 420 as rough surface section generally parallel to the surface of the board 4, to a longitudinally adjoining configuration formed of the isosceles trapezoid from which the portion thereof has been cut off.

As shown in FIG. 8B, resin layers 6 mixed with phosphor are provided in vicinity of the light emission elements 5. Thus the line light source can be obtained that rarely has unevenness in luminance, bright lines, and unevenness in chromaticity even when light is emitted with a desired color and a high luminance.

Each of the first recesses 414 is composed of two slanted surfaces of the two adjoining configurations which surfaces face each other in the longitudinal direction and of the one planar surface section 420 positioned between the two slanted surfaces. The second recesses 416 each have the V-shaped section and are formed just above the light emission elements 5. The second recesses 416 each have a shape that is generally in plane symmetry with respect to a plane extending through center of the light emission element 5 and including the direction of width of the board 4 and the direction of the normal to the surface of the board 4.

The planar surface section 420 is a rough surface. In detail, a machining accuracy of part of the forming die corresponding to the planar surface sections 420 is made lower than a machining accuracy of part of the forming die corresponding to parts other than the planar surface sections 420. Specifically, this can be achieved by machining of the parts of the die corresponding to the planar surface sections 420 with use of a cutting tool having a large radius and by increase in feed pitch of the tool in the machining.

In such a manner, an irregularly uneven shape on the planar surface sections 420 is formed with a plane size on the order of 100 to 200 μm and height of several score micrometers.

In the fifth embodiment, the planar surface sections 420 are rough surfaces, and thus light that has been guided in the longitudinal direction to vicinity of the first recesses 414 and has been condensed can efficiently be taken out of the coating resin through the planar surface sections 420.

Sixth Embodiment

Figure 9A:
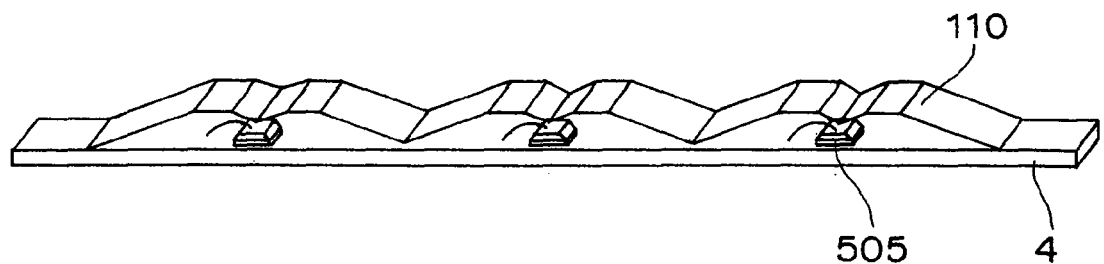
FIG. 9A is a perspective view of a line light source device in accordance with a sixth embodiment of the invention.
Figure 9B:
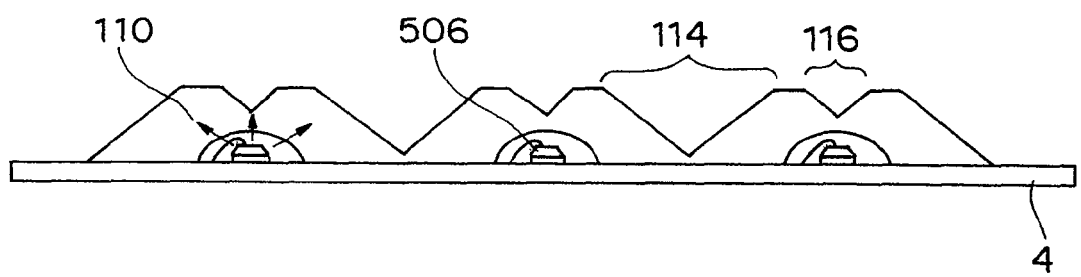
FIG. 9B is a longitudinal section of the line light source device of the sixth embodiment.
Figure 9C:
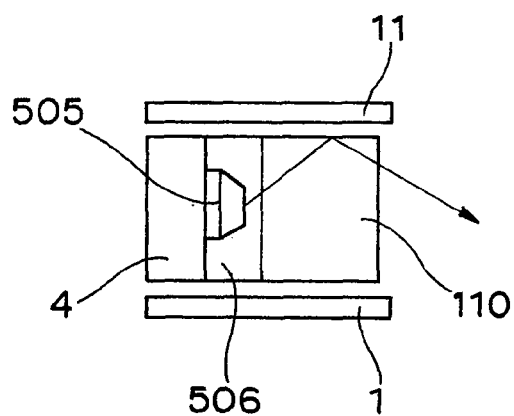
FIG. 9C is a section of a printed board on which reflection sheets are provided, the section taken through a light emission element along a direction of width of the printed board.
Figure 9D:
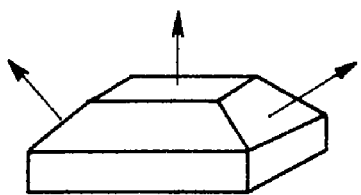
FIG. 9D is a view showing an LED chip used in the device and directions of light emitted from the chip.
Figure 9D:
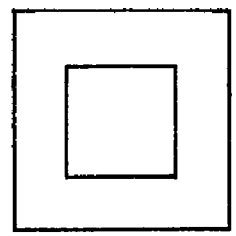
Figure 9E:
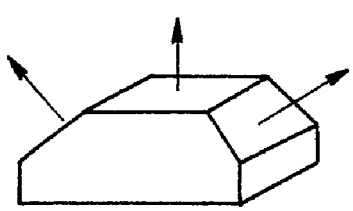
FIG. 9E is a view showing an LED chip in a modification of the sixth embodiment and directions of light emitted from the chip.
Figure 9E:
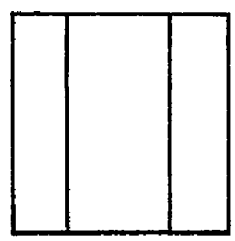

FIG. 9A is a perspective view of a line light source device in accordance with a sixth embodiment of the invention, and FIG. 9B is a longitudinal section of the line light source device of the sixth embodiment. FIG. 9C is a section of a printed board, the section taken through a light emission element 5 along a direction of width of the printed board having reflection sheets. FIG. 9D is a view showing an LED chip used in the device and directions of light emitted from the chip, and FIG. 9E is a view showing an LED chip in a modification of the sixth embodiment and directions of light emitted from the chip.

Components of the line light source device of the sixth embodiment that are the same as the components of the line light source device of the second embodiment are designated by the same reference numerals and description thereof is omitted. For the line light source device of the sixth embodiment, description is omitted on functional effects and modifications that are common to those of the line light source device of the first embodiment but is provided only on configurations that are different from those of the line light source device of the second embodiment, and functional effects and modifications that are different from those of the line light source device of the first and second embodiments.

Among the most common light emission elements that can be used in the line light source devices of the invention are the light emission elements 5 (e.g., rectangular LED chips) shaped like a rectangular parallelopiped and used in the line light source devices of the first to fifth embodiments. On condition that an LED chip in use is shaped like a rectangular parallelopiped, light distribution characteristics of the LED chip typically have a peak in a direction of a normal to a top surface of the LED chip. The shape and light distribution characteristics of the LED chip, however, are not limited to this example.

In the sixth embodiment, as shown in FIGS. 9A and 9B, a light emission end of the LED chip 505 has a trapezoidal shape in section, and side surfaces of the LED chip 505 with respect to the longitudinal direction are slanted relative to the direction of the normal to the surface of the board 4.

As shown in FIG. 9D, the light emission end of the LED chip 505 may have a shape formed from a quadrangular pyramid from which an upper portion thereof has been cut off along a plane parallel to a bottom surface of the quadrangular pyramid. As shown in FIGS. 9E, the light emission end of the LED chip may have two identical side surfaces that are generally parallel to each other and that have a trapezoidal shape.

In the sixth embodiment and this modification, as shown in FIG. 9D or FIG. 9E, light is emitted in the direction of the normal to the top surface of the LED chip and in directions of normals to the trapezoidal sloped surfaces slanted by a specified angle relative to the top surface, so that the light can be scattered in advance by the LED chip itself, in contrast to the second embodiment.

In addition, the light can be scattered over a wider angle by a synergistic effect of the shape of the LED chip 505 and second recesses 116 that have a V-shaped section and that are formed on transparent sealing resin parts 110 provided just above the LED chips 505. Therefore, the line light source device is capable of scattering light more linearly. By appropriate adjustment of angles of the trapezoidal sloped surfaces (the angles of emission of light) relative to a plane including the normal of the board 4 surface and the direction of width of the board 4, light can be emitted from between the adjoining LED chips 505 in the sealing resin layers 110, and the emitted light can more efficiently be linearized.

FIGS. 16A through 16D are diagrams showing an experimental example of luminous intensity distributions along longitudinal direction of board in a conventional line light source device and the line light source devices of the embodiments.

Figure 16A:
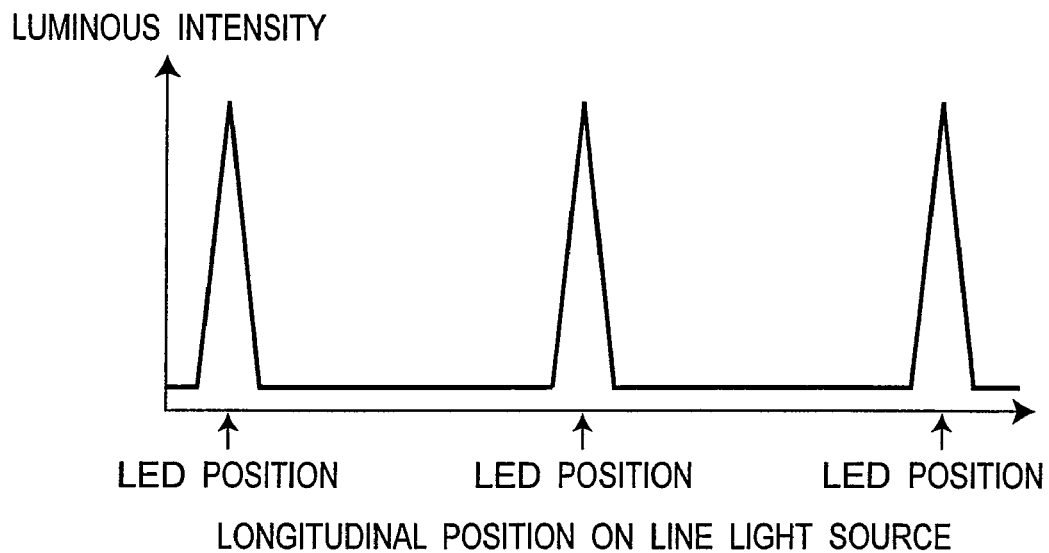
FIG. 16A is a diagram showing a luminous intensity distribution in a longitudinal direction of a conventional line light source device.
Figure 21:
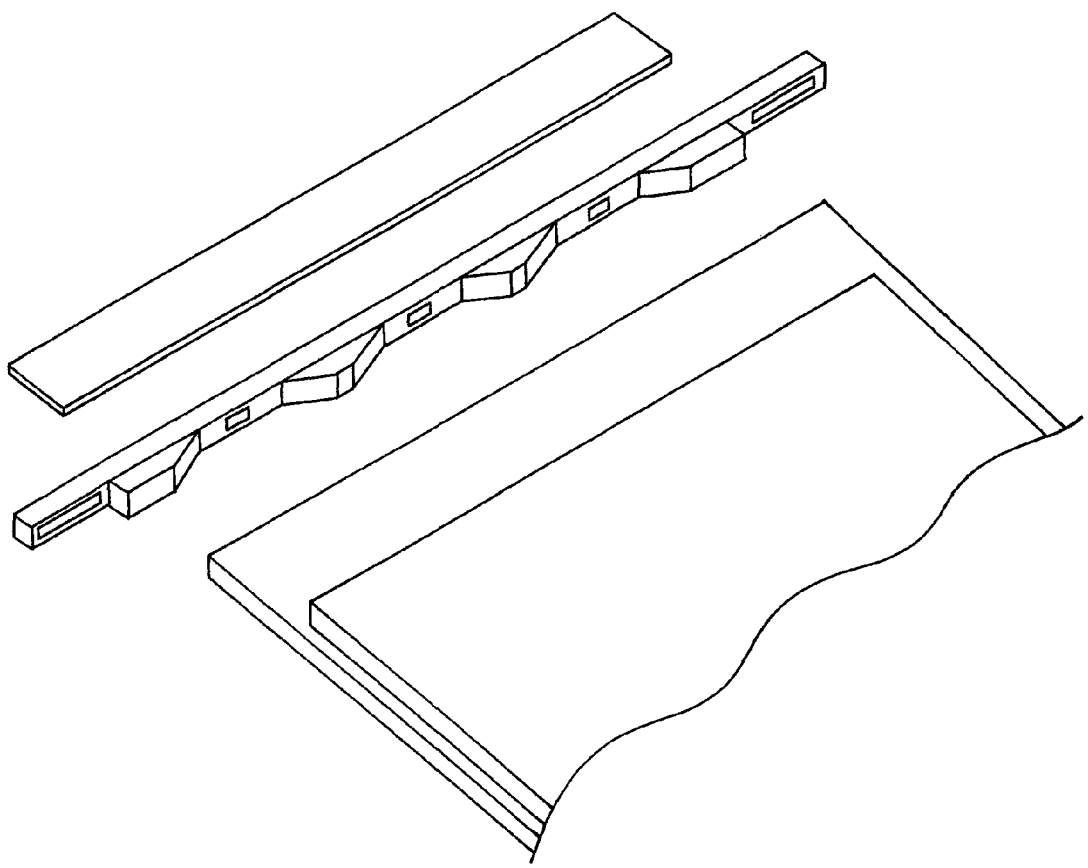
FIG. 21 is a perspective view of a plane light emission device having the conventional line light source device.
Figure 22:
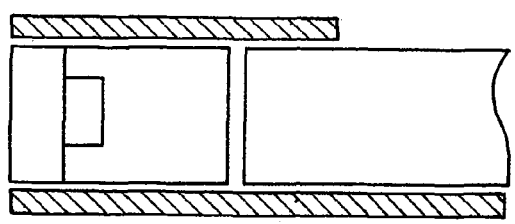
FIG. 22 is a section of the line light source device in the plane light emission device shown in FIG. 21, the section taken along a direction of width of the line light source device.
Figure 23A:
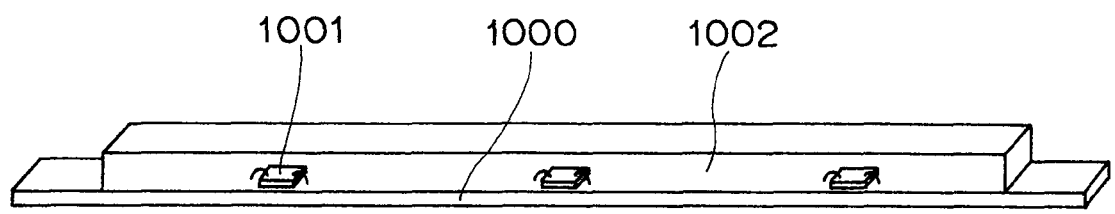
FIG. 23A is a perspective view of another conventional line light source device.
Figure 23B:
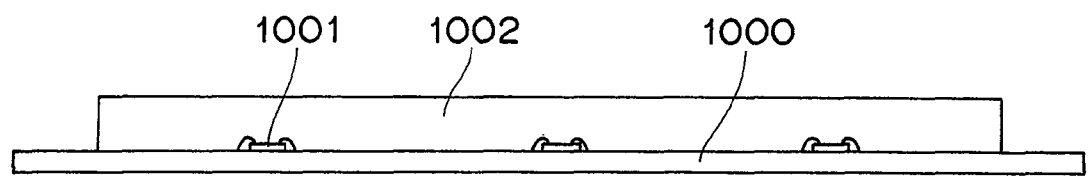
FIG. 23B is a longitudinal section of the conventional line light source device shown in FIG. 23A.
Figure 24:
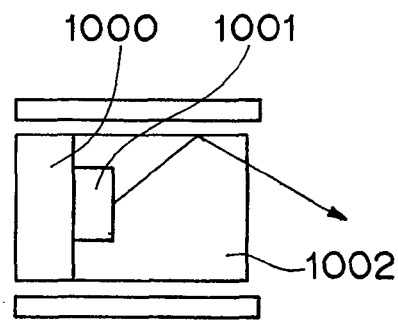
FIG. 24 is a lateral section of another conventional line light source device.

Specifically, FIG. 16A is a diagram showing an experimental example of luminous intensity distribution along longitudinal direction of the board in the conventional line light source device shown in FIG. 21.

Figure 11A:
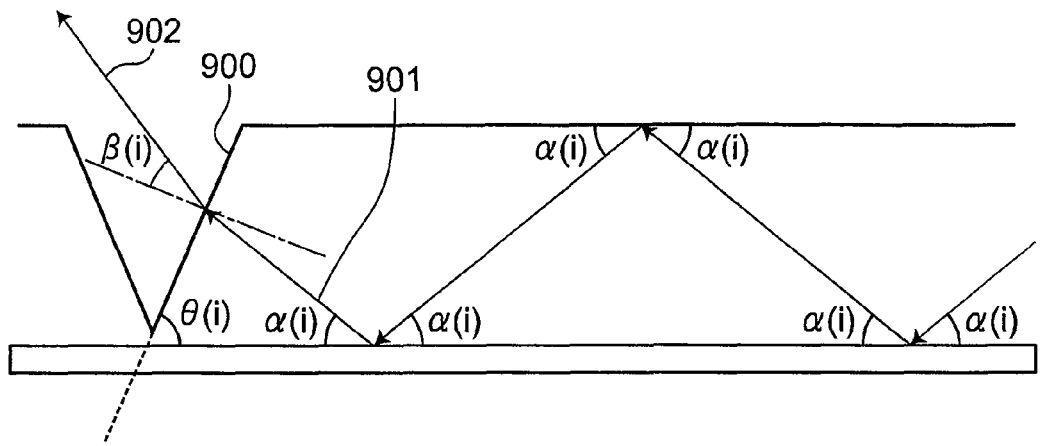
FIG. 11A is a diagram illustrating a functional effect of the invention.
Figure 11B:
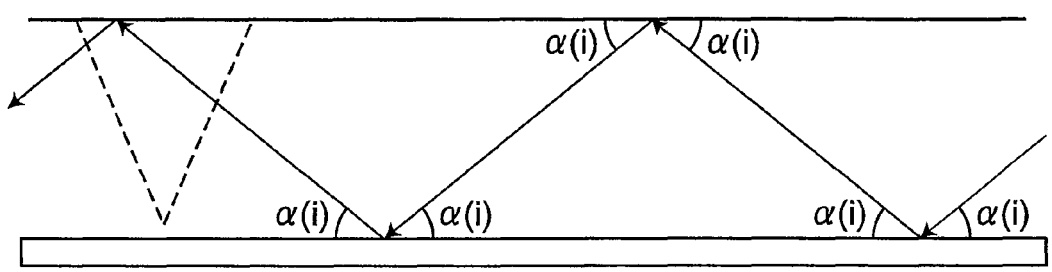
FIG. 11B is a diagram illustrating a problem of a conventional device.
Figure 11C:
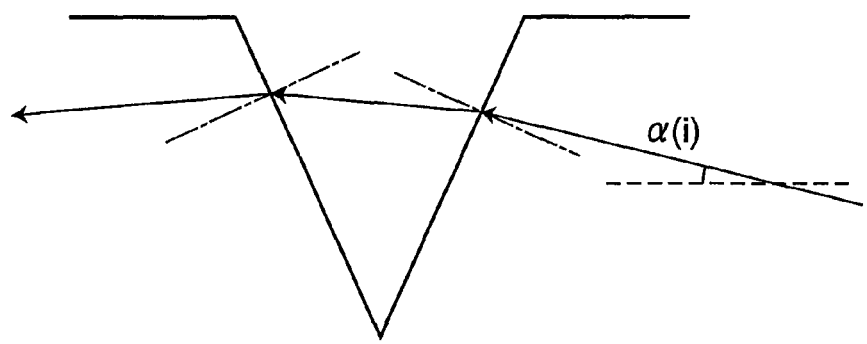
FIG. 11C is a diagram showing a ray of light that is not emitted to outside from vicinity of a first recess in the device having the first recess.
Figure 12A:
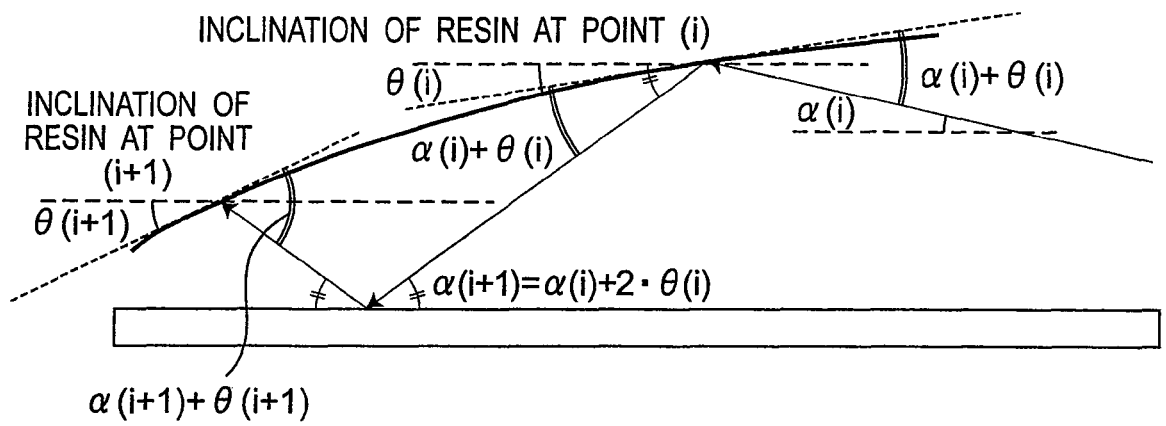
FIG. 12A is a diagram illustrating a functional effect of the invention.
Figure 12B:
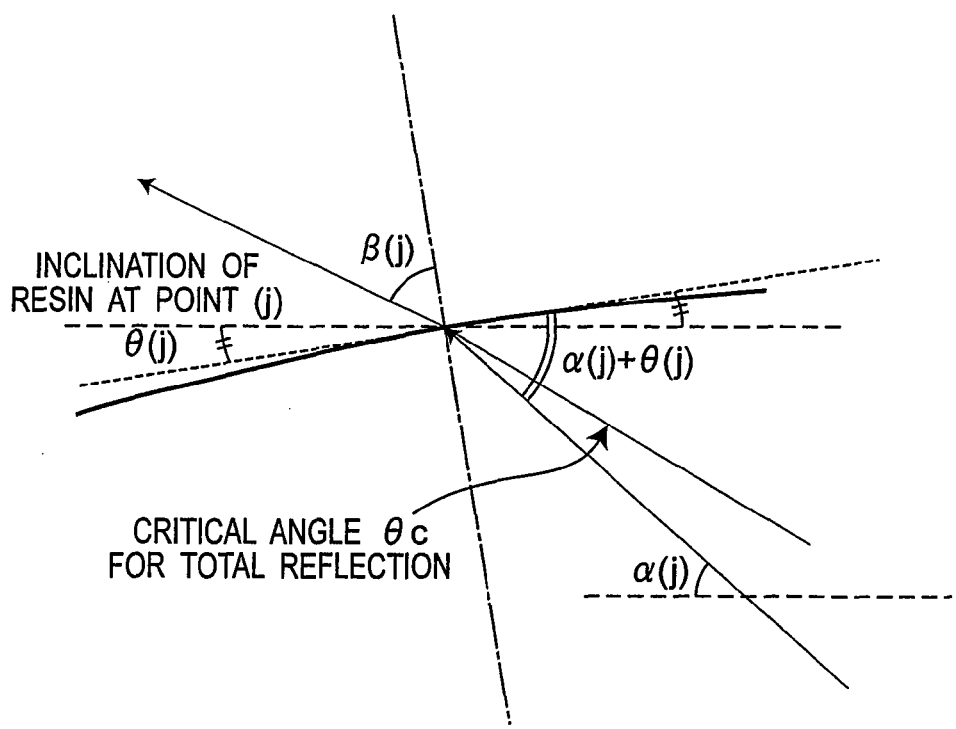
FIG. 12B is a diagram illustrating a functional effect of the invention.
Figure 13A:
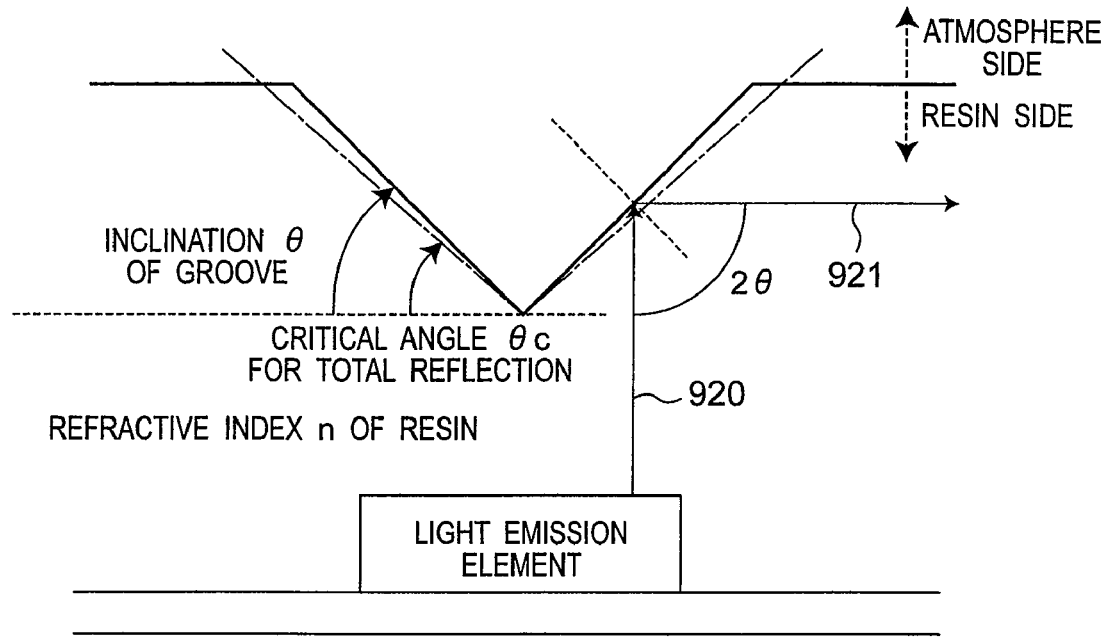
FIG. 13A is a diagram illustrating a functional effect of the invention.
Figure 13B:
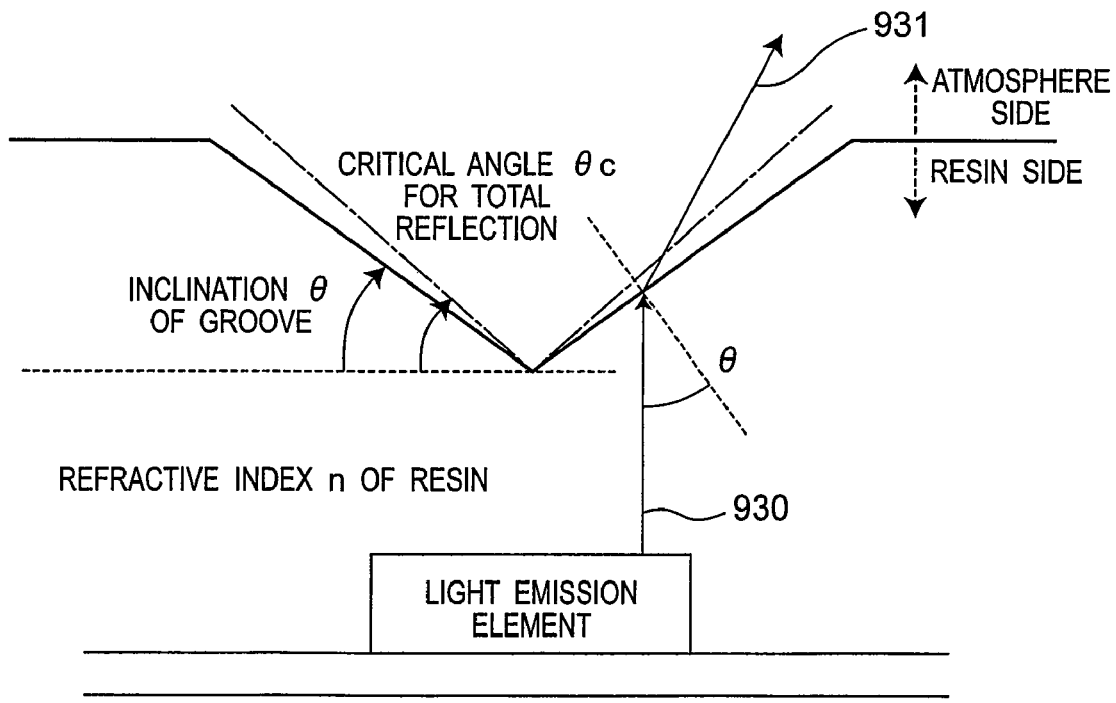
FIG. 13B is a diagram illustrating a functional effect of the invention.
Figure 14A:
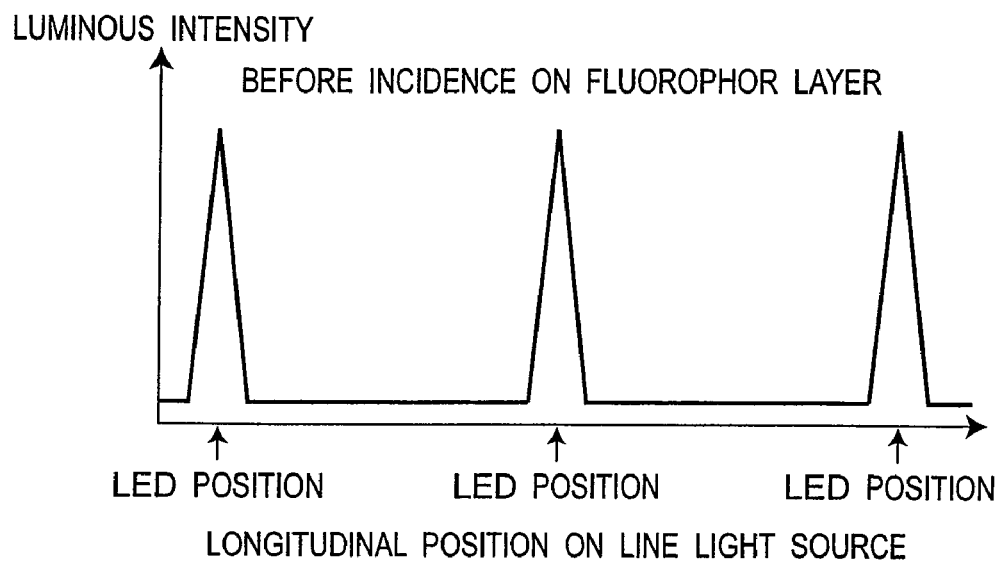
FIG. 14A is a diagram illustrating a problem of a conventional device.
Figure 14B:
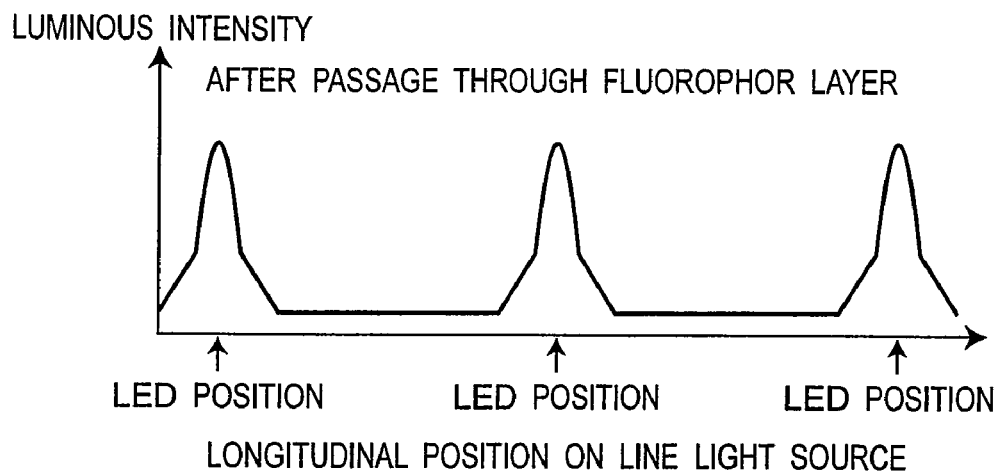
FIG. 14B is a diagram illustrating a problem of a conventional device.
Figure 14C:
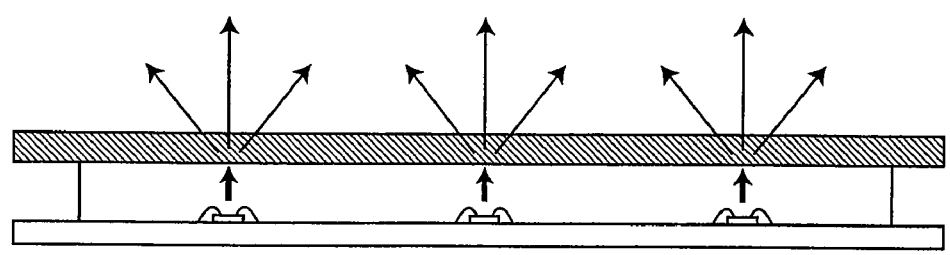
FIG. 14C is a diagram illustrating a problem of a conventional device.
Figure 15A:
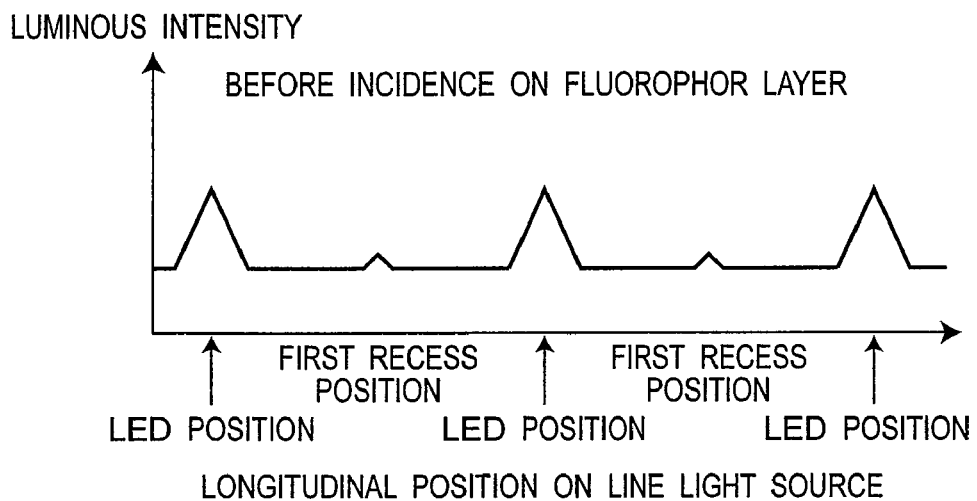
FIG. 15A is a diagram illustrating a functional effect of the invention.
Figure 15B:
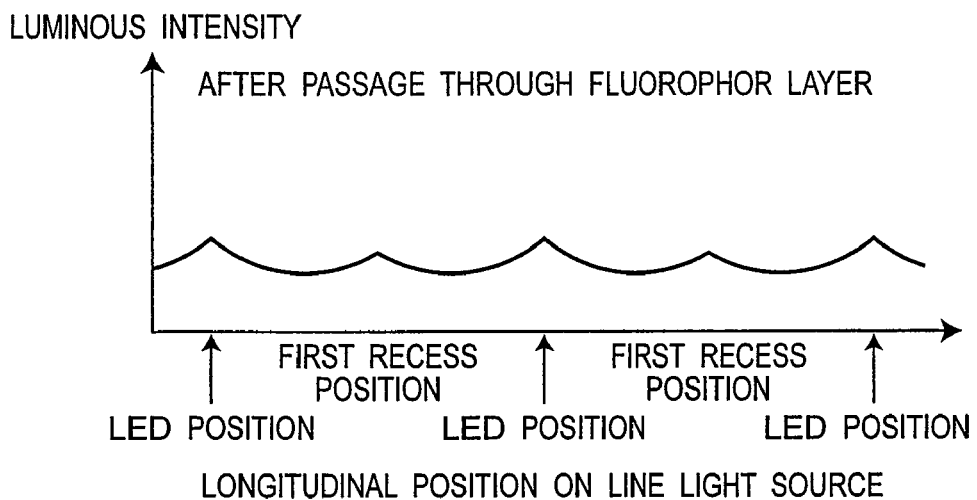
FIG. 15B is a diagram illustrating a functional effect of the invention.
Figure 15C:
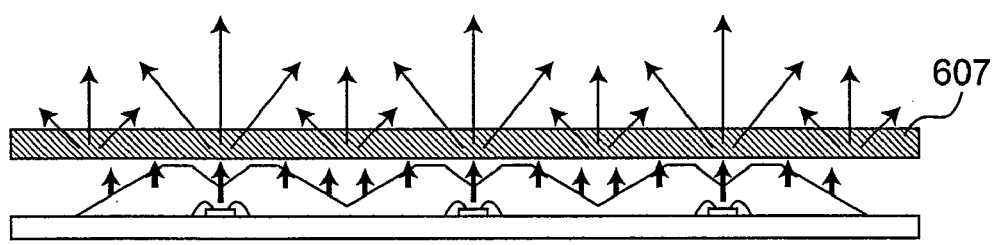
FIG. 15C is a diagram illustrating a functional effect of the invention.
Figure 16B:
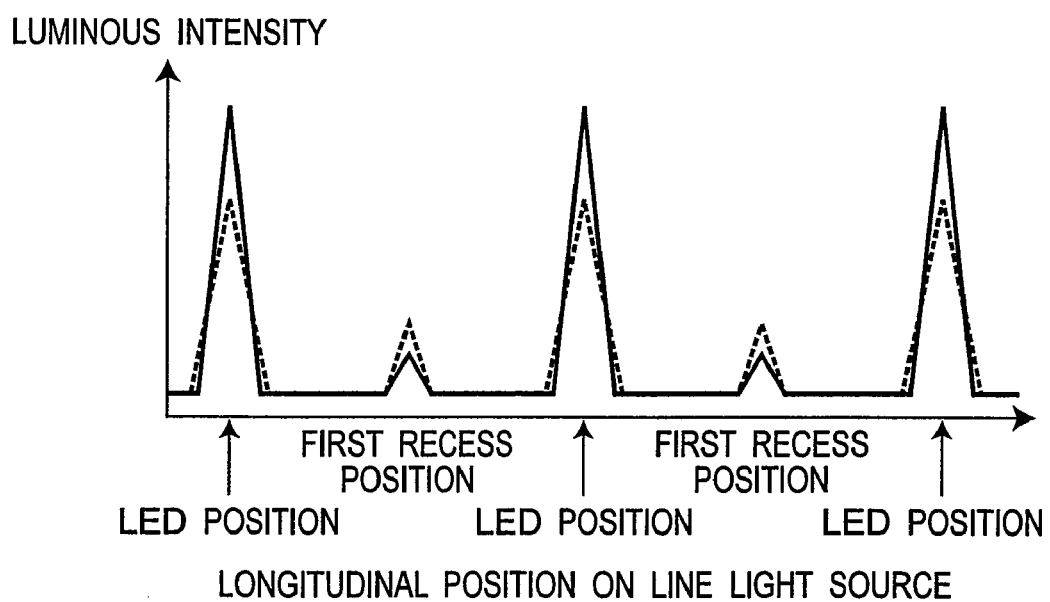
FIG. 16B is a diagram showing a luminous intensity distribution in a longitudinal direction of a line light source device of the invention.

A solid line shown in FIG. 16B shows an experimental example of luminous intensity distribution in the line light source device that is shown in FIG. 11A and that has the first recess 900 formed thereon. On the other hand, a broken line shown in FIG. 16B shows an experimental example of luminous intensity distribution in a line light source device of a modification in which first recesses having a section not in shape of a letter V are formed in the embodiment designated by the solid line of FIG. 16B.

Figure 16C:
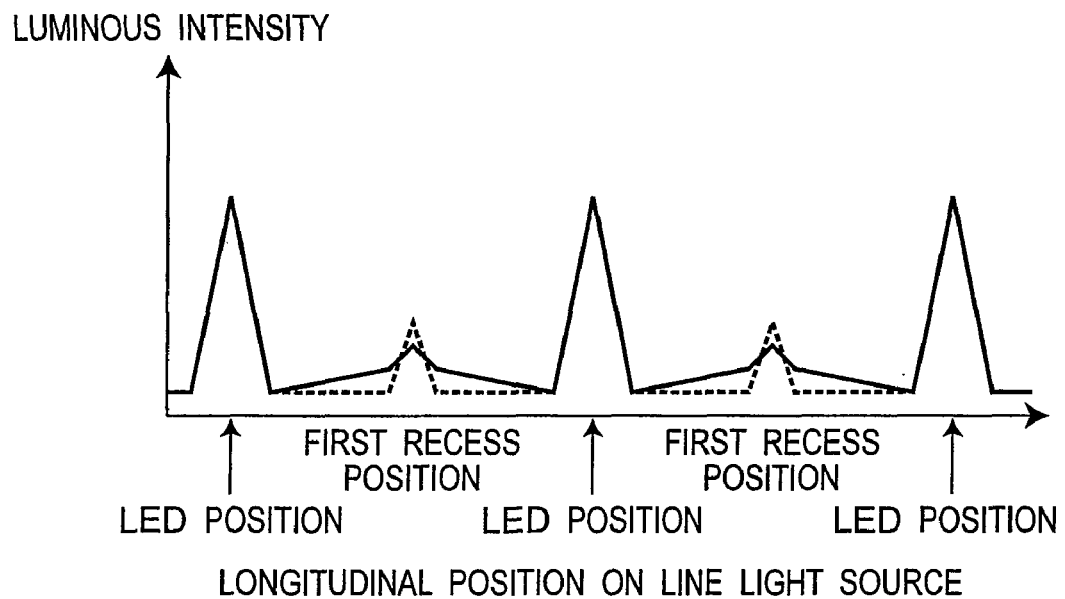
FIG. 16C is a diagram showing a luminous intensity distribution in a longitudinal direction of a line light source device of the invention.

A solid line shown in FIG. 16C shows an experimental example of luminous intensity distribution in the line light source device of the first embodiment, and a broken line shown in FIG. 16C is the same as the broken line shown in FIG. 16B.

Figure 16D:
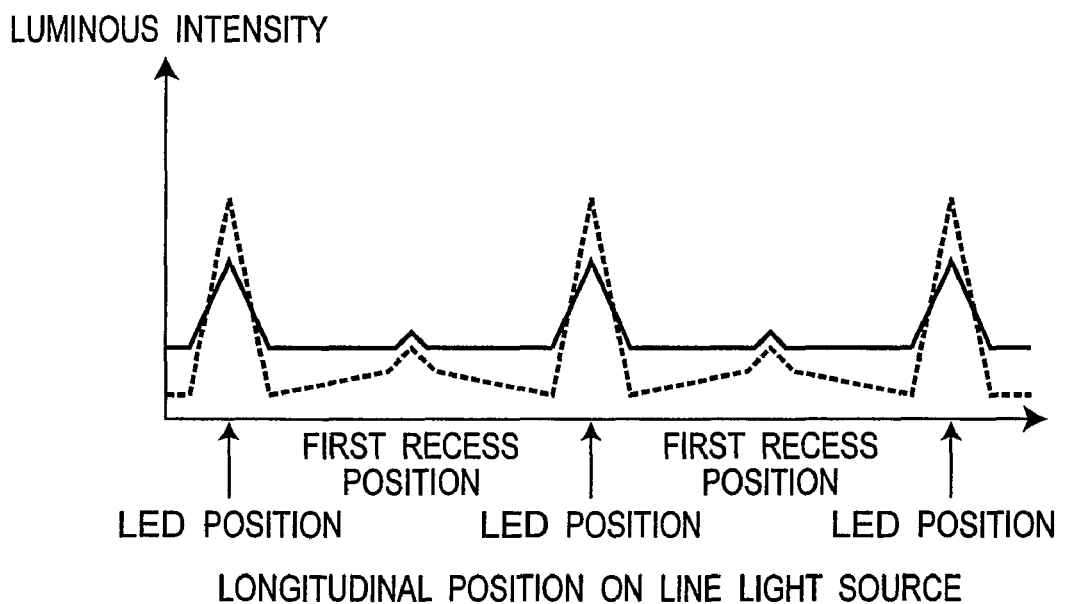
FIG. 16D is a diagram showing a luminous intensity distribution in a longitudinal direction of a line light source device of the invention.

A solid line shown in FIG. 16D shows an experimental example of luminous intensity distribution in the line light source device of the second embodiment, and a broken line shown in FIG. 16D is the same as the solid line shown in FIG. 16C.

As seen from comparison between FIG. 16A and FIG. 16B, variation in luminous intensity distribution corresponding to the longitudinal positions can be decreased by the line light source device of the invention, in comparison with the conventional line light source device. According to a result shown in FIG. 16C, the variation in luminous intensity distribution corresponding to the longitudinal positions can be further decreased by formation of the second recesses having the V-shaped section. According to a result shown in FIG. 16D, the variation in luminous intensity distribution corresponding to the longitudinal positions can be further decreased by the second embodiment, in comparison with the first embodiment.

In the invention, the surfaces of the resin parts may lack the recesses in the regions corresponding to the light emission elements in the direction of the normal to the surface of the board. That is, the second recesses may be omitted.

Figure 10:
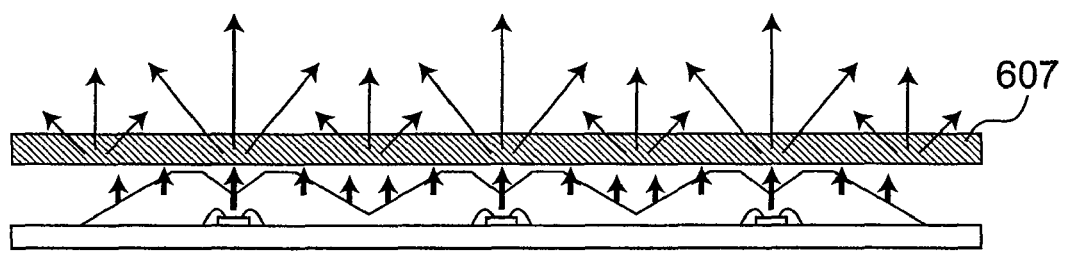
FIG. 10 is a schematic diagram showing the line light source device of the invention that has a phosphor part.

Though the phosphor is localized only around the light emission elements 5, 505 in the line light source devices of the first to sixth embodiments, a phosphor part 607 may separately be provided, in the invention, opposite to the board with respect to the resin parts, as shown in FIG. 10. In short, optimal conditions for manufacture regarding at least one of dispersion and placement of phosphor may be selected in accordance with cost, variation in luminance, and variation in chromaticity that are required.

Figure 17:
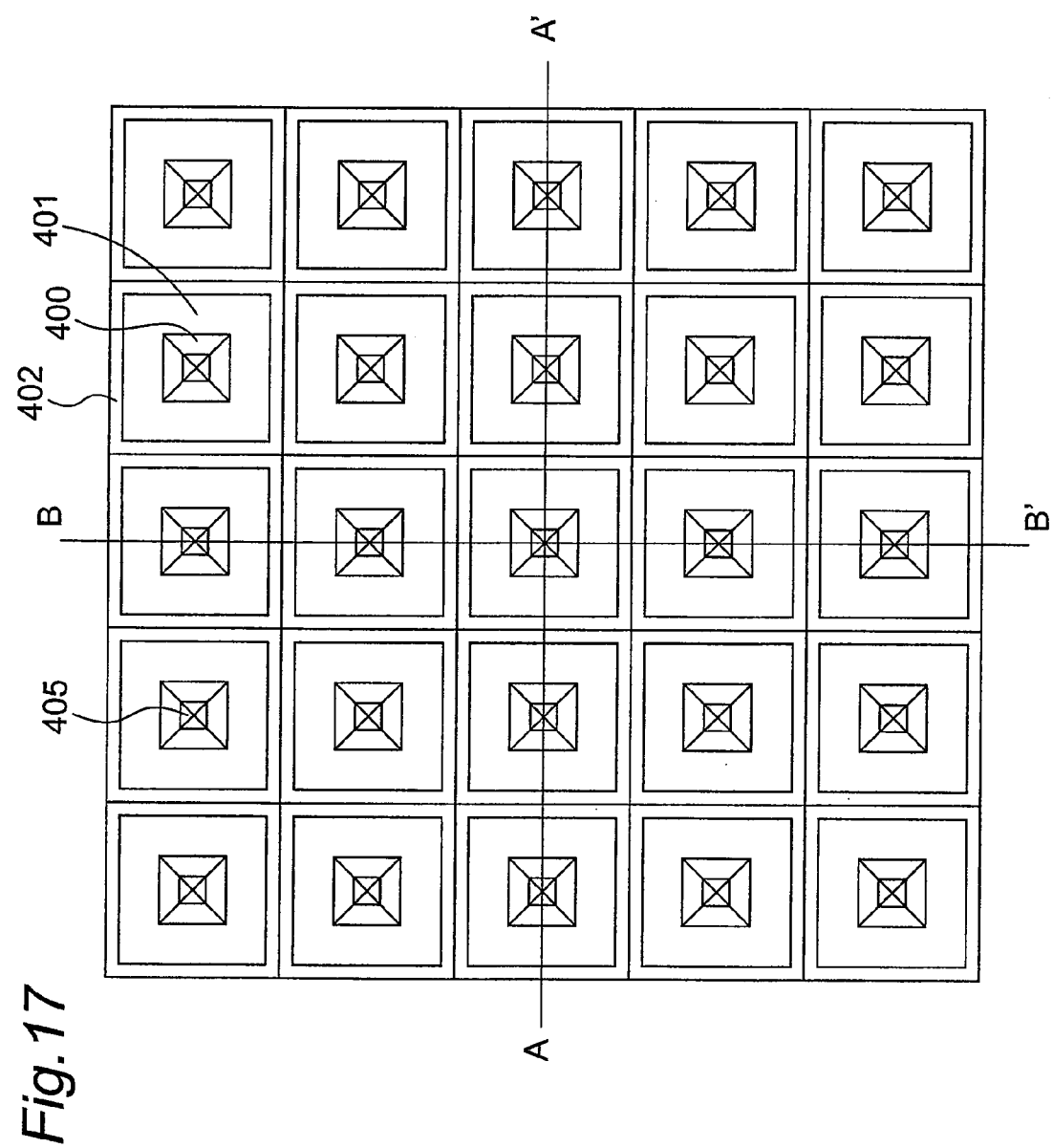
FIG. 17 is a diagram showing a plane light source device in accordance with one embodiment of the invention.

FIG. 17 is a diagram showing a plane light source device in accordance with one embodiment of the invention.

In FIG. 17, a section taken along a line A-A' and a section taken along a line B-B' are identical to the longitudinal section of the line light source device that is shown in FIG. 5B.

In the plane light source device, a plurality of LED chip units are placed on a flat board so as to form a two-dimensional plane, that is, so as to be made two-dimensional.

In the plane light source device, as shown in FIG. 17, the LED chip units are placed in a grid-like pattern. Each of the LED chip units is formed of an LED chip 405 sealed with sealing resin. Each of the LED chip units constitutes a light emission element unit.

As shown in FIG. 17, recesses 400 shaped like inverse quadrangular pyramids are formed, as the second recesses, in positions corresponding to the LED chips 405 in a direction of a normal of the board, on surfaces of the sealing resin sealing the LED chips 405.

Around the recesses 400, the surfaces of the sealing resin have planar sections 401 each having a square periphery. Around the planar sections 401, the surfaces of the sealing resin each have slanted surfaces 402 having a square periphery in the plan view shown in FIG. 17.

The resin parts composed of each of the above sealing resin are formed by the grid-like arrangement of units of the resin parts each composed of the recess 400, the planar section 401, and the slanted surfaces 402. In an imaginary cut surface that passes through centers of a plurality of LED chip units adjoining each other and that is perpendicular to the surface of the board, adjoining end parts of the resin parts of the adjoining LED chip units form the first recesses. That is, the adjoining two slanted surfaces 402 of the adjoining LED chip units form the first recess. The plane light source device has a portion formed by the grid-like arrangement, on the board, of the LED chip units each having the LED chip 405 and one unit of the resin parts composed of the recess 400, the planar section 401, and the slanted surfaces 402. In the top plan view of the plane light source device shown in FIG. 17, depiction of phosphor layers covering vicinity of the LED chips is omitted. The phosphor layers are each shaped like a hemisphere.

Figure 18:
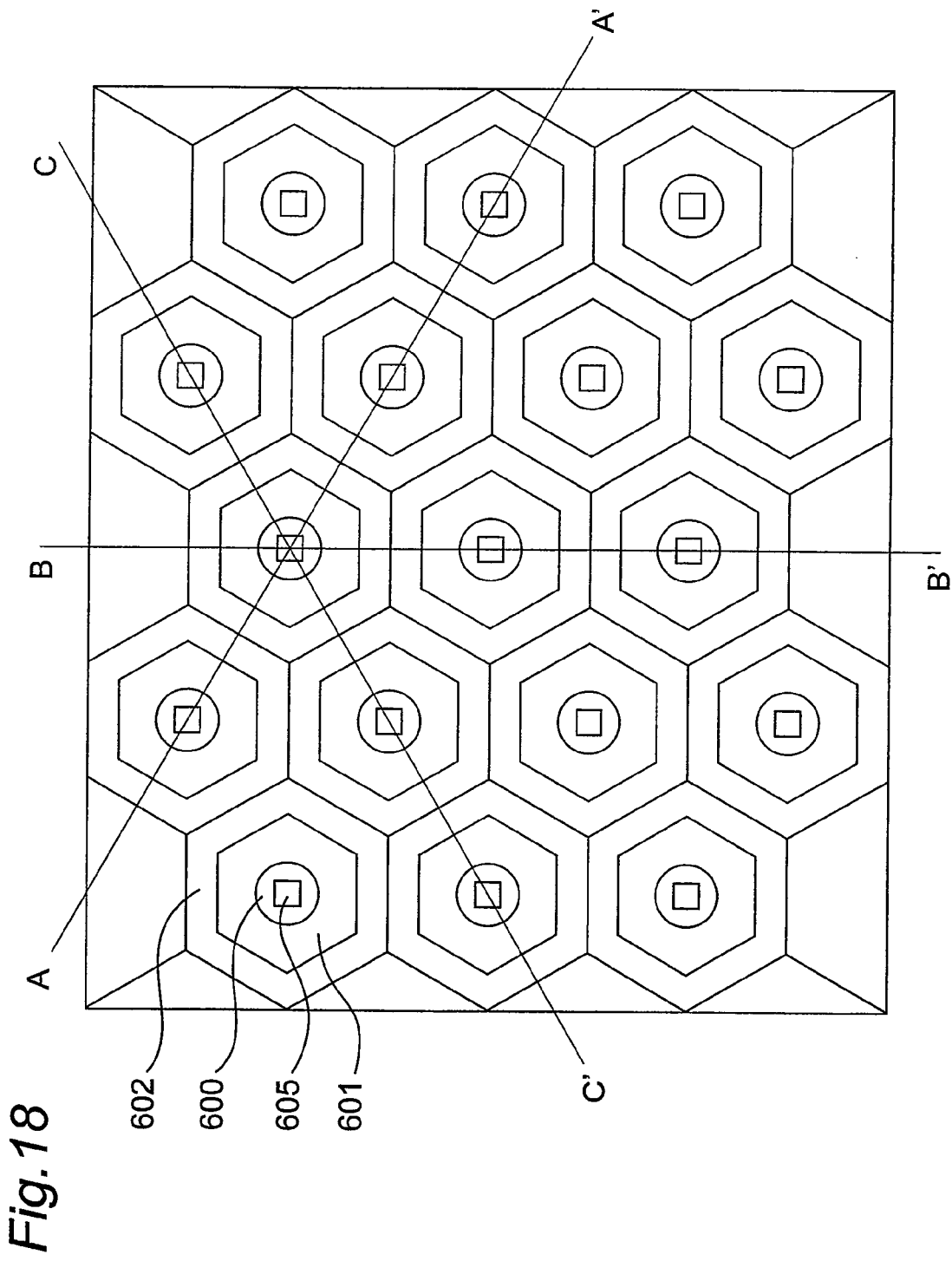
FIG. 18 is a diagram showing a plane light source device in accordance with another embodiment of the invention.
Figure 19A:
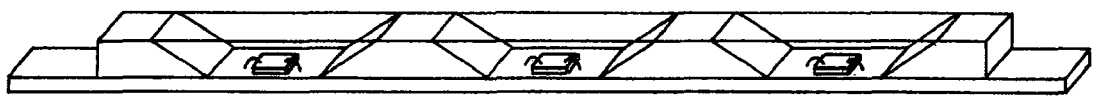
FIG. 19A is a perspective view of a conventional line light source device.
Figure 19B:
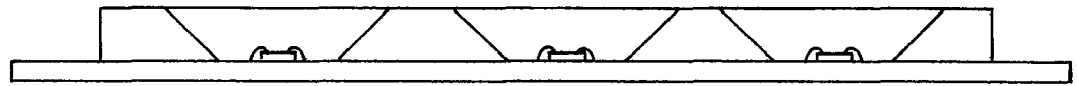
FIG. 19B is a longitudinal section of the conventional line light source device.
Figure 19C:
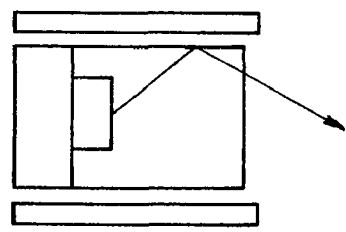
FIG. 19C is a lateral section of the conventional line light source device.
Figure 20A:
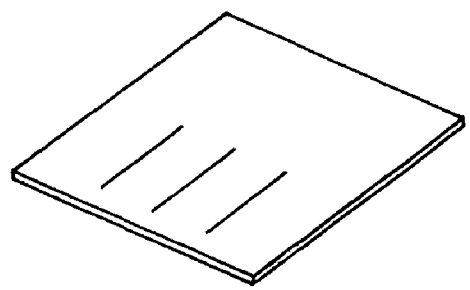
FIG. 20A is a diagram illustrating a procedure of a method of manufacturing the conventional line light source device.
Figure 20B:
FIG. 20B is a diagram illustrating a procedure of a method of manufacturing the conventional line light source device.
Figure 20C:
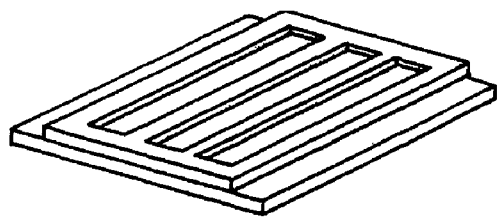
FIG. 20C is a diagram illustrating a procedure of a method of manufacturing the conventional line light source device.
Figure 20D:
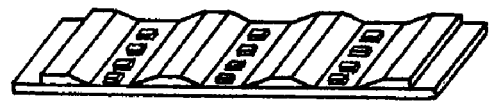
FIG. 20D is a diagram illustrating a procedure of a method of manufacturing the conventional line light source device.
Figure 20E:
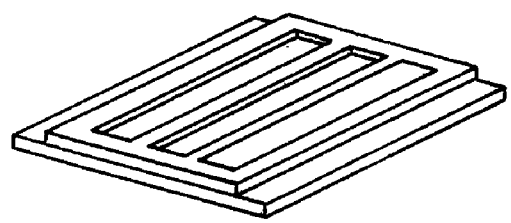
FIG. 20E is a diagram illustrating a procedure of a method of manufacturing the conventional line light source device.
Figure 20F:
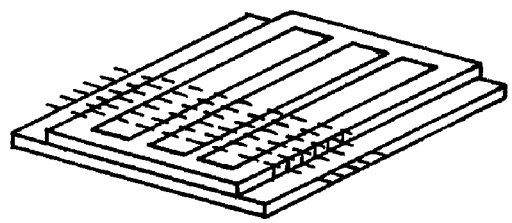
FIG. 20F is a diagram illustrating a procedure of a method of manufacturing the conventional line light source device.

FIG. 18 is a diagram showing a plane light source device in accordance with another embodiment of the invention.

In FIG. 18, a section taken along a line A-A', a section taken along a line B-B' and a section taken along a line C-C' are identical to the longitudinal section of the line light source device that is shown in FIG. 5B.

In the plane light source device, a plurality of LED chip units are placed on a flat board so as to form a two-dimensional plane, that is, so as to be made two-dimensional.

In the plane light source device, as shown in FIG. 18, the plurality of LED chip units are placed without a gap so as to form a two-dimensional pattern shaped like a honeycomb.

Specifically, the LED chip units are placed at centers of equilateral hexagons on the flat board.

Each of the LED chip units is formed of an LED chip 605 sealed with sealing resin. Each of the LED chip units constitutes a light emission element unit. As shown in FIG. 18, recesses 600 shaped like inverse cones are formed, as the second recesses, in positions corresponding to the LED chips 605 in a direction of a normal to the board, on surfaces of the sealing resin sealing the LED chips 605 (there may be formed recesses shaped like inverse hexagonal pyramids in place of the recesses 600 shaped like inverse cones).

Around the recesses 600, the surfaces of the sealing resin have planar sections 601 each having a periphery in shape of an equilateral hexagon. Around the planar sections 601, the surfaces of the sealing resin have slanted surfaces 602 having a periphery in shape of an equilateral hexagon in the top plan view shown in FIG. 18. Resin parts composed of each of the above sealing resin are formed by arrangement of units of the resin part each composed of the recess 600, the planar section 601, and the slanted surfaces 602 such that straight lines constituting edges of the slanted surface 602 of the resin parts of adjoining units correctly coincide with each other.

The plane light source device has a portion formed by the arrangement, on the board, of the LED chip units each having the LED chip 605 and one unit of the resin parts composed of the recess 600, the planar section 601, and the slanted surfaces 602 such that the straight lines constituting the edges of the slanted surface 602 of the resin parts of the adjoining units correctly coincide with each other. In this manner, the plurality of LED chip units are placed without a gap so as to form the two-dimensional pattern shaped like the honeycomb.

In an imaginary cut surface that passes through centers of a plurality of LED chip units adjoining each other and that is perpendicular to a surface of the board, adjoining end parts of the resin parts of the adjoining LED chip units form first recesses. That is, the adjoining two slanted surfaces 602 of the adjoining LED chip units form the first recess.

In the top plan view of the plane light source device shown in FIG. 18, depiction of phosphor layers covering vicinity of the LED chips is omitted. The phosphor layers are each shaped like a hemisphere.

In the embodiments shown in FIGS. 17 and 18, the resin parts of the plurality of LED chip units range integrally. In the plane light source device of the invention, however, regions having no resin may exist between adjoining light emission element units. That is, part (bottom surfaces) of surfaces of the first recesses of the plane light source device of the invention may be formed of the surface of the board.

There may be configured a plane light source device in which the parts depicted in shape of squares in FIG. 17 are made in shape of circles, a plane light source device in which the parts depicted in shape of equilateral hexagons in FIG. 18 are made in shape of circles, and the like. In those devices, however, intervals between the units may be widened and/or narrowed and/or breaks having no sealing resin may be formed.

As a result, sufficient spread of light may not be attained in regions between the units and light emission from each of the units may be accentuated. In such devices, therefore, it is preferable to make gentle angles of the slanted surfaces of sealing resin in the regions between the units and to roughen the surfaces of the sealing resin so that light may be scattered and subsequently taken out toward top surface side. In the devices with the breaks having no sealing resin, the surface of the board within the breaks may be roughened or metal films having great unevenness may be formed on the breaks, so that light may be scattered and subsequently taken out toward the top surface side. There may be provided a configuration in which the slanted surfaces around the units may be roughened so that light is scattered and subsequently taken out. Such configurations make it possible to construct a plane light source in which luminances of light emission therefrom are made uniform.

In the plane light source devices described above, electrode patterns for drawing out electrodes of the LED chips to outside are formed on the surface of the board but depiction thereof is omitted. The electrode patterns are electrodes of the plane light source device that are to be connected to external electrodes, and are separately consolidated for electrical connection to anode side and cathode side. The connection electrodes may be provided on periphery of the surface of the board where sealing resin is not formed or may be provided on a back surface of the board with conductive layers penetrating the board. On the front surface of the board may be provided optically reflective metal layers.

Preferably, the plane light source device described above is placed just under a liquid crystal panel and a liquid crystal display is thereby constructed. The plane light source device described above may be housed in a case having a transparent cover on a surface thereof so that lighting equipment is produced.

In the plane light source device of the embodiment, the section taken along the line A-A', the section taken along the line B-B' and the like in FIG. 17 are identical to the longitudinal section of the line light source device that is shown in FIG. 5B. In the plane light source device of the invention, however, the section taken along the line A-A', the section taken along the line B-B' and the like in FIG. 17 may be identical to the section shown in FIG. 1B, 6B, 7B, 8B, or 9B.

In the plane light source device of the invention, the section taken along the line A-A', the section taken along the line B-B', the section taken along the line C-C', and the like in FIG. 18 may be identical to the section shown in FIG. 1B, 6B, 7B, 8B, or 9B.

The plane light source device of the invention has only to have a configuration in which the plurality of light emission element units each having the light emission element and the resin part that is placed so as to cover the light emission element are placed in the two-dimensional pattern on the board, in which generally all the intervals between the adjoining light emission elements are the same, and in which a section in a plane including the direction of the normal to the board and a line segment linking two centers of the adjoining light emission elements coincides with a section in a plane including the direction of the normal to the board of the line light source device of the invention and a line segment linking two centers of the adjoining light emission elements in the line light source device.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A line light source device comprising:
    a board extending in a longitudinal direction thereof and having a surface,
    a plurality of light emission elements placed on the surface of the board at intervals along the longitudinal direction, and
    resin parts that are placed so as to cover the plurality of light emission elements, wherein
    the resin parts have first recesses on a surface in a direction of a normal to the surface of the board positioned between the light emission elements adjoining in the longitudinal direction, second recesses in regions corresponding to the light emission elements in the direction of the normal, and portions in which distance from the surface of the board to the first recess in the direction of the normal decreases with distance from the light emission element in the longitudinal direction within a range from center of the light emission element to a midpoint between the light emission element and the next light emission element in the longitudinal direction, and
    the surface of the board has a property of reflecting light, whereby the light is guided in the resin part in the longitudinal direction.

2. The line light source device as claimed in claim 1, wherein the first recesses have portions that cause total reflection of light traveling in the longitudinal direction.

3. The line light source device as claimed in claim 1, wherein the second recesses have portions that cause total reflection of light traveling in the direction of the normal to the board.

4. The line light source device as claimed in claim 1, wherein the first recesses each have a plurality of protrusions or the first recesses each have a rough surface section having a surface finish rougher than that of the resin surface regions aligning with the light emission elements in the direction of the normal.

5. The line light source device as claimed in claim 1, wherein the resin parts have fluorescent substance containing parts made of material containing fluorescent substance.

6. The line light source device as claimed in claim 5, wherein
    the fluorescent substance containing parts are placed so as to enclose the light emission elements, and
    the fluorescent substance containing parts are spaced apart from the surfaces of the resin parts.

7. The line light source device as claimed in claim 1, wherein phosphor parts composed of phosphor or material containing phosphor are provided opposite to the board with respect to the resin parts in the direction of the normal.

8. The line light source device as claimed in claim 1, wherein
    a light emission end of each of the light emission elements with respect to the direction of the normal has a generally trapezoidal shape in a section in the longitudinal direction, and
    directions of normal to side surfaces of the end of the light emission element with respect to the longitudinal direction are slanted relative to the direction of the normal to the surface of the board.

9. The plane light emission device comprising the line light source device as claimed in claim 1.

10. A liquid crystal display comprising the plane light emission device as claimed in claim 9.

11. A plane light source device comprising:
a board, and
a plurality of light emission element units placed in a predetermined two-dimensional pattern without a gap on a surface of the board,
each of the plurality of light emission element units comprising:
a light emission element, and
a resin part covering the light emission element, wherein
in an imaginary cut surface that passes through centers of the plurality of light emission element units adjoining each other and that is perpendicular to the surface of the board, adjoining end parts of the resin parts of the adjoining light emission element units form first recesses, the resin parts of the plurality of light emission element units have second recesses in regions that correspond to the light emission elements of the plurality of light emission element units in a direction of a normal to the board, and
the surface of the board has a property of reflecting light, thereby
the light is guided in the resin part parallel to the surface of the board.

12. The plane light source device as claimed in claim 11, wherein the resin parts of the plurality of light emission element units range integrally.

13. The plane light source device as claimed in claim 11, wherein the two-dimensional pattern is a grid-like pattern.

14. The plane light source device as claimed in claim 11, wherein the two-dimensional pattern is a honeycomb-like pattern.

* * * * *